(12) United States Patent
Jacobvitz et al.

(10) Patent No.: US 10,552,259 B2
(45) Date of Patent: Feb. 4, 2020

(54) RECOVERY COMBINING HARD DECODING, SOFT DECODING AND ARTIFICIAL CODEWORD GENERATION

(71) Applicant: Western Digital Technologies, Inc., San Jose, CA (US)

(72) Inventors: Adam Noah Jacobvitz, Mountain View, CA (US); Gulzar Ahmed Kathawala, Fremont, CA (US); Kroum Stanimirov Stoev, Pleasanton, CA (US); Bin Wu, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 28 days.

(21) Appl. No.: 15/922,793

(22) Filed: Mar. 15, 2018

(65) Prior Publication Data

US 2019/0286516 A1    Sep. 19, 2019

(51) Int. Cl.
*H03M 13/00* (2006.01)
*G06F 11/10* (2006.01)
(Continued)

(52) U.S. Cl.
CPC .......... *G06F 11/1068* (2013.01); *G11C 16/26* (2013.01); *G11C 29/52* (2013.01); *H03M 13/2906* (2013.01)

(58) Field of Classification Search
CPC ..... G06F 11/1068; G11C 16/26; G11C 29/52; H03M 13/2906
See application file for complete search history.

(56) References Cited

U.S. PATENT DOCUMENTS 8,099,652 B1    1/2012 Alrod et al.
8,627,188 B2    1/2014 Weingarten et al.
(Continued)

OTHER PUBLICATIONS

Peleato et al, "Adaptive Read Thresholds for NAND Flash"; IEEE Transactions on Communications, vol. 63, No. 9, Sep. 2015; http://cmrr-star.ucsd.edu/static/pubs/adaptive_thresholds.pdf; 13 pages.

*Primary Examiner* — Samir W Rizk
(74) *Attorney, Agent, or Firm* — Loza & Loza, LLP; Gabriel Fitch

(57) ABSTRACT

The present disclosure, in various embodiments, describes technologies and techniques for use by a data storage controller for decoding codewords during an error correction read recovery process. In illustrative examples, an iterative procedure exploits artificial codewords generated using information obtained from a NAND or other non-volatile memory (NVM) in a previous sense operation. That is, procedures are described that use information obtained in one stage of read recovery to facilitate a subsequent stage to reduce the need to perform additional NAND senses. In one example, information obtained from a sense operation performed for an initial hard bit decode is used in subsequent soft bit decodes. Moreover, iterative decoding procedures are provided that progressively increase correction strength. The procedures may alternate between hard and soft reads while using syndrome weight to determine a failed bit code gradient for identifying the sensing voltage for a next hard sense.

29 Claims, 16 Drawing Sheets

(51) Int. Cl.
  *G11C 16/26* (2006.01)
  *H03M 13/29* (2006.01)
  *G11C 29/52* (2006.01)

(56) References Cited

U.S. PATENT DOCUMENTS

| | | |
|---|---|---|
| 9,025,393 B2 | 5/2015 | Wu et al. |
| 9,367,389 B2 | 6/2016 | Alhussien et al. |
| 9,595,320 B2 | 3/2017 | Wu et al. |
| 2011/0149650 A1 | 6/2011 | Huang et al. |
| 2015/0149871 A1 | 5/2015 | Chen et al. |
| 2015/0278015 A1 | 10/2015 | Haratsch et al. |
| 2015/0303948 A1* | 10/2015 | Yoon ..................... G11C 29/52 714/764 |
| 2017/0125111 A1* | 5/2017 | Sankaranarayanan ....................... G06F 11/0727 |
| 2017/0125114 A1* | 5/2017 | Alhussien .............. G11C 16/28 |

* cited by examiner

RECOVERY COMBINING HARD DECODING, SOFT DECODING AND ARTIFICIAL CODEWORD GENERATION

FIELD

The subject matter described herein relates to data storage devices and controllers. More particularly, the subject matter relates, in some examples, to read recovery error correction procedures for use with NANDs or other nonvolatile memory (NVM) devices.

INTRODUCTION

Storage device controllers often include error detection and error correction systems to facilitate read recovery when reading data from a storage device, such as when reading data from a NAND of a solid state drive (SSD). Read recovery refers to the recovery of data when a failed bit count (FBC) is too high so that a codeword cannot be corrected using normal read procedures within the data storage device controller. A main objective during read recovery is to minimize latency for the recovery operation. To this end, NVM device controllers may include hard bit decoders and soft bit decoders that attempt to decode codewords obtained from a NAND. It would be desirable to provide improved read recovery procedures that more intelligently and efficiently operate to decode data to minimize overall read recovery latency. In particular, it would be desirable to provide improved read recovery procedures that minimize, or at least reduce, the number of NAND senses needed to recover a codeword.

SUMMARY

One embodiment of the present disclosure provides a method for use by a data storage controller, including: obtaining first and second codewords by reading initial sense values from a memory device using first and second sense voltage thresholds shifted relative to one another; applying one or both of the first and second codewords to a hard bit decoder or a soft bit decoder; generating one or more additional codewords from the initial sense values; and applying the one or more additional codewords to the hard bit decoder or to the soft bit decoder to decode the one or more additional codewords.

Another embodiment of the present disclosure provides a data storage controller, where the data storage controller includes a processing system configured to: obtain first and second codewords by reading initial sense values from the memory device using first and second sense voltage thresholds shifted relative to one another; apply one or both of the first and second codewords to a hard bit decoder or a soft bit decoder; generate one or more additional codewords from the initial sense values; and apply the one or more additional codewords to the hard bit decoder or to the soft bit decoder to decode the one or more additional codewords.

Yet another embodiment of the present disclosure provides an apparatus for use with a data storage controller, comprising: means for obtaining first and second codewords by reading initial sense values from a memory device using first and second sense voltage thresholds shifted relative to one another; means for applying one or both of the first and second codewords to a hard bit decoder or a soft bit decoder; means for generating one or more additional codewords from the initial sense values; and means for applying the one or more additional codewords to the hard bit decoder or to the soft bit decoder to decode the one or more additional codewords.

BRIEF DESCRIPTION OF THE DRAWINGS

The subject matter described herein will now be explained with reference to the accompanying drawings of which.

DETAILED DESCRIPTION

Figure 1:
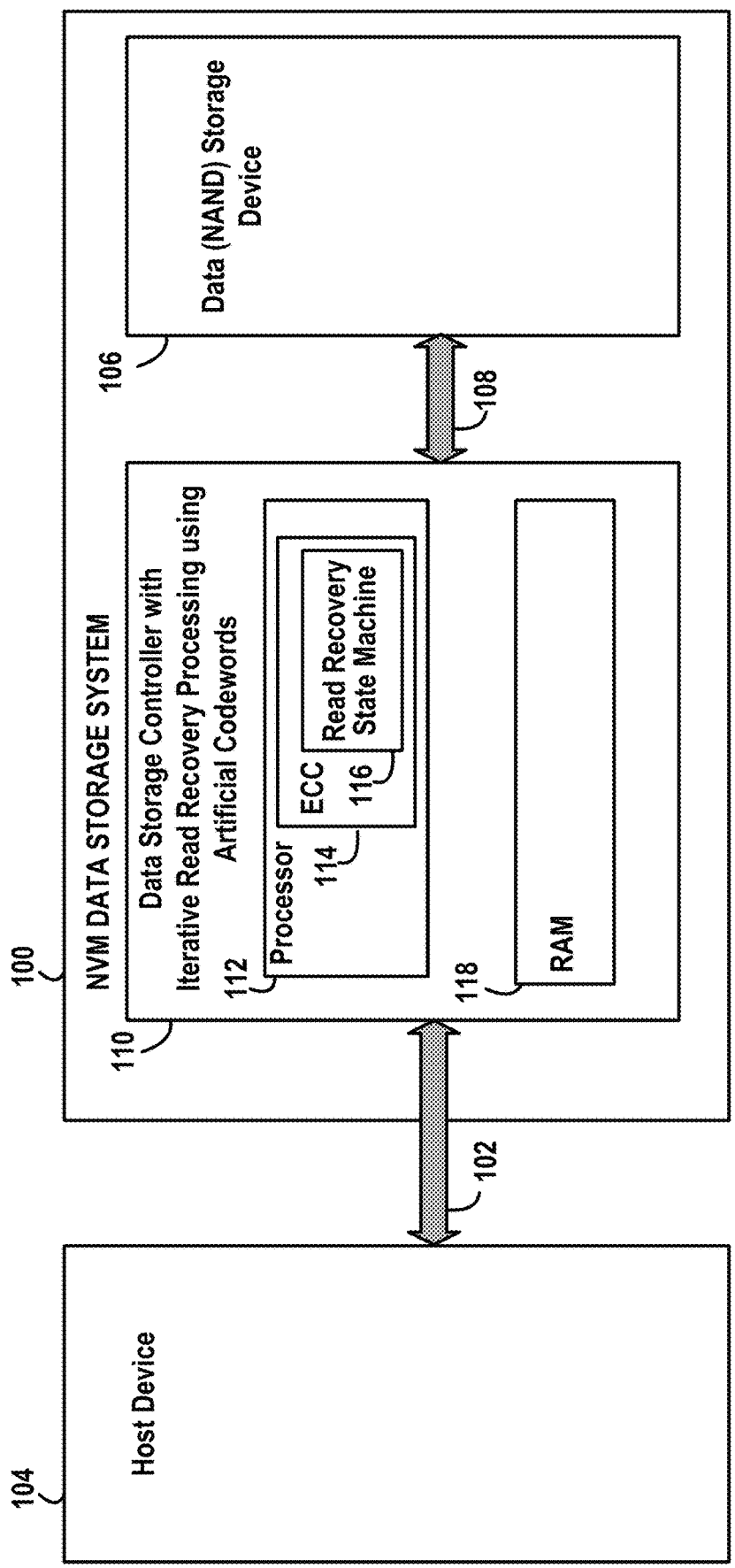
FIG. 1 illustrates an exemplary NVM data storage system having a data storage controller and a data storage device (such as a NAND), where the data storage controller is equipped for iterative read recovery processing using artificial codewords.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Overview

Aspects of the present disclosure provide various devices, systems, apparatus, and methods for providing error detection read recovery procedures that more intelligently and efficiently operate to decode data to, e.g., minimize overall read recovery latency. One particularly useful implementation of these read recovery procedures is as a hardware engine, module or black box that executes all of the read recovery procedures in a finite state machine. Herein, the single hardware engine that executes all of the read recovery procedures is referred to as Read Recovery in a Box (RBB). However, the various read recovery procedures may also be implemented purely in software or with a combination of both hardware and software. Independent of the particular implementation, the procedures described herein can handle read recovery from the start of the overall recovery process until it is completed or until alternative recovery is needed (such as the use of a separate XOR-based erasure code procedure).

As noted above, read recovery refers to the recovery of data when a failed bit count (FBC) is too high so that a codeword cannot be corrected using normal read procedures (i.e. a normal read path) within a data storage controller. In this regard, state-of-the-art NANDs or other high density non-volatile memory (NVM) components of Solid Stage Drive (SSDs) typically seek to store as much data as possible in the transistors of the device, resulting in some percentage of reads that cannot be decoded using the normal read procedures, hence requiring some form of error correction by a data storage controller to decode the data. These additional error correction procedures also may be referred to as "read recovery flow" (RRF).

By way of example, to read data from a NAND, a sense point (i.e. a particular voltage threshold value) is selected and a sense voltage is applied to the cells of the NAND. In response, some transistors within the NAND turn on, while others remain off, based on the amount of charge trapped in particular layers defined within the gates of the transistors. Normally, any responsive voltage that is lower than the sense voltage is considered to be a binary one and anything higher that the sense voltage is considered to be a binary zero. The resulting binary values form a codeword that can be applied to a hard bit decoder to attempt to identify the data value that corresponds to the codeword to thereby readout the data. If the codeword is not decoded, i.e. it does not match stored codeword data, another sense point is selected and the procedure is repeated to generate another codeword, which is again applied to the hard bit decoder. If the data still cannot be read, additional senses may be performed at still different sense points (i.e. different sense voltage thresholds). In some cases, soft bit information may be obtained for applying to a soft bit decoder. Various additional techniques may be applied to improve the chances of obtaining a decodable codeword. For example, the data storage controller may assess a gradient in FBC and, based on the gradient, the controller determines a directionality to adjust the sense points and, if possible, identifies an optimal read point that provides the best chance of obtaining a decodable codeword (and thereby read out the data and, in so doing, recover from the initial errors that triggered the read recovery flow).

Thus, in some examples, read recovery may include the following main procedures: 1) determining which sense point adjustment direction will reduce FBC (i.e. determining how to adjust sense voltage thresholds to improve the likelihood of obtaining a decodable codeword); 2) locating a minimal FBC read point (i.e. a sense voltage threshold that will likely achieve a minimum FBC and hence a maximize the chances of obtaining a decodable codeword; 3) locating optimal read levels (i.e. voltage sense points) to separate weak bits from strong bits; and 4) reading out the data. Each step takes time and power to execute.

However, in many data storage controllers, information used in one read recovery operation (such as a hard bit decode) is not used in a subsequent read recovery operation (such as a soft bit decode). Rather, additional senses are performed in the NAND, requiring the transmission of additional data along a bus interconnecting the NAND and the data storage controller, increasing the overall latency of the read operation and delaying the delivery of data to a host device such as a computer processor that requested the data. In these devices, the various read recovery components are often implemented as separate modules that do not share information. Moreover, these techniques may be regarded as being relatively "course grained" in the sense that the techniques include modules that operate independently and do not fine tune the operations of modules based on information obtained earlier from other modules.

It is noted that some read recovery systems, which are not necessarily prior art to the present application, use progressively more soft-bit information but do not have a mechanism of dynamically determining where the next soft-bit read should be. Other systems may operate to find a minimum FBC point in a voltage threshold (Vt) distribution, which then may be used in subsequent correction operations, but the reads are only used to find the minimum FBC and are not decoded or used to generate soft-bit information.

Within various implementations described herein, systems and methods are provided for use with data storage controllers during read recovery operations that instead use information obtained in one stage of an overall read recovery flow to facilitate a subsequent stage to reduce the need to perform addition senses within the NAND (and the latency associated with the data transfer from the NAND to the data storage controller). For example, information obtained from a sense operation performed for an initial hard bit decode may be used in subsequent soft bit decodes. In many of these exemplary implementations, a set of iterative error correction decoding procedures are provided that progressively increase in correction strength. That is, instead of discarding information generated in previous steps, these procedures, which may be implemented in a single module (e.g. RRB), incorporate previous information into a current decoding step to increase or maximize the probability of data recovery. The procedures thus break down the recovery problem into two dimensions: finding a more optimal FBC minimum read point and generating soft-bit information. In some examples, the procedures operate by alternating between hard reads, soft reads, and using the syndrome weight to determine the FBC gradient for use in identifying an optimal sensing voltage for a next hard sense (that will achieve a minimal FBC for the codewords obtained).

Still further, many of the examples described herein exploit the generation of additional codewords without performing additional senses, wherein the additional codewords are referred to herein as "artificial codewords." Briefly, in some examples, a sense is performed to read out a codeword for applying to a hard bit decoder during an initial read recovery stage. If the codeword is not successfully decoded in the initial read recovery stage, a second codeword is read in using a sense point (i.e. voltage threshold) shifted slightly relative to the first sense operation. Four additional codewords are then generated (using a binning technique described below) from information obtained during the previous pair of senses. These additional codewords are referred to as "artificial" codewords to conveniently distinguish them from "normal" codewords obtained directly from sense operations. However, it should be understood that the artificial codewords are every bit as real as other codewords. The artificial codewords may be then applied to the hard bit decoders in a second read recovery stage. In this manner, information obtained from initial senses for an initial read recovery stage is used to generate additional codewords for use in a subsequent read recovery stage, thus reducing the need to perform addition senses within the NAND (and reducing the associated read latency). As will be explained, to generate artificial codewords, cells are placed into "bins" during the sensing process so as to minimize the number of required senses and transfers.

If none of the codewords are successfully decoded using hard bit decoders, soft bit decoders then may be employed. If the data is still not decoded, an additional sense operation may be performed (with the sense point shifted once again) to read more codewords from which still more artificial codewords may be generated, and additional hard or soft bit decodes may be attempted based on the new codewords. With more codewords, there is a greater likelihood the data will be successfully decoded. As will be explained, using the binning techniques described herein, each time a new sense executes in the NAND, a number of codewords equal to Number_of_Senses$^{Number\_of\_Senses}$ is generated, thus generating an exponentially increasing number of codewords with each additional sense. For example, a 3-sense read (e.g. middle page for tri-level cell (TLC) when using 2-3-2 sensing) may provide a codeword (CW) sequence of 1 CW, 2 CWs+6 artificial CWs, 2+25 artificial CWs, etc. A 4 sense read would have a codeword sequence of 1 CW, 2 CWs+14 artificial CWs, etc. After generating the new codewords, the syndrome weight of each codeword is used to determine if the codeword can be decoded by hard or soft bit decoding. If a particular codeword syndrome weight is low enough to merit soft bit decoding, the additional sense points are used to generate soft information for the given soft decoding mode.

In this manner, a set of iterative error correction decoding procedures or stages are provided that progressively increase in correction strength because each new stage provides an increasing number of codewords. Although this procedure can be continued for an arbitrary number of stages, the data storage controller may be programmed to end the procedure based on some predetermined termination criteria (such as after four iterations or if a gradient decay rate is too low, as will be discussed below). Thereafter, different error correction procedures may be performed by the data storage controller, such as XOR-based erasure code procedures.

Within examples described herein, syndrome weights are calculated for each codeword to determine whether hard or soft bit decoding should be attempted during any particular stage of the overall iterative read recovery procedure. For example, if the syndrome weight for a particular codeword is below a hard decode threshold, then a hard decode is attempted for the codeword. If the syndrome weight for the particular codeword is below a soft decode threshold, a soft decode is attempted for the codeword. Syndrome weights may also be used to assess the FBC gradient for use in identifying the size or direction (e.g. up vs. down) of the shifts in sense voltages performed prior to each new hard sense. In this manner, each new read sense of a page provides at least three benefits: exponentially more codewords with which to attempt hard-decoding; more/stronger soft bit information; and a direction (e.g. increase or decrease) for the next sense on each read level. Additionally, in some examples, for each new NAND read, sense points are shifted (or otherwise adjusted) by an amount selected or determined to obtain a new codeword that has a greatest likelihood of being decoded.

Thus, in some examples, a single set of NAND data allows for: (a) hard decoding using just the initial data; (b) artificial codeword generation using the binning mechanism; and then either (b)(1) hard decoding of the artificial codeword if the syndrome weight of the artificial codeword is in a decodable range or (b)(2) soft decoding of the artificial codeword using information already available in the initial read data set as soft information, or (c) if the syndrome weight is too high or the soft-decode fails, generating new codeword candidates for the next read point while using the FBC gradient (described below) derived from the syndrome weights to obtain new codewords with a greater likelihood of being successfully decoded.

Exemplary NVM NAND Embodiments

FIG. 1 illustrates, at a high level, an NVM data storage system 100 configured to, among many other functions, implement read recovery by exploiting at least some of the aforementioned iterative procedures. The data storage system 100 receives read requests (or other memory access commands) along a bus 102 from a host device 104, which may be a videocamera, laptop computer, or the like. The read requests are used to access a data storage device 106, which, in this example, is a NAND. Values obtained from physical dies within the NAND 106 in response to the read requests are returned via a bus 108 to a data storage controller 110 that is equipped or otherwise configured to perform iterative read recovery processing using artificial codewords. To this end, the data storage controller includes a processor 112 having an error correction controller (ECC) 114 with a read recovery (RR) state machine component 116 that performs the actual read recovery using one or more of the iterative procedures or techniques summarized above, wherein information obtained in one stage of an overall read recovery flow is used to facilitate a subsequent stage to reduce the need to perform addition senses within the NAND 106 (and to reduce the latency associated with the bus 108). Values obtained from the NAND 106 in response to read requests may be stored within a RAM 118 (along with any other data that the processor 112 may require). Eventually, once data is successfully read from the NAND 106 in response to the read request (including completion of any error correction that may be required to complete the read), the read data is returned to the host device via the bus 102 for use by the host device. Note that FIG. 1 illustrates only selected features of an exemplary system. A more complete system is described below.

Figure 2:
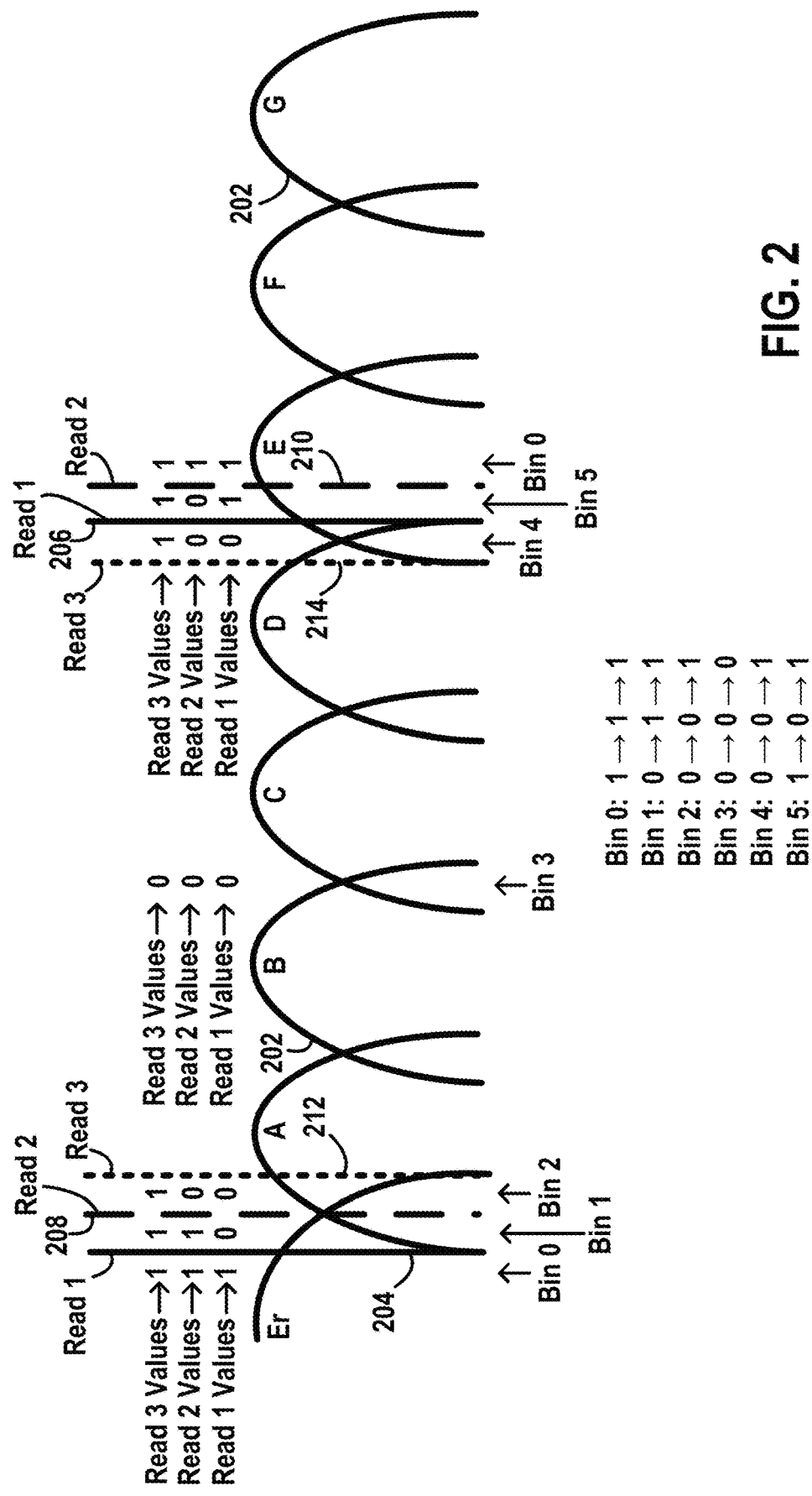
FIG. 2 graphically illustrates an exemplary lower page read that may be performed during read recovery while using binning techniques.

FIG. 2 illustrates an exemplary lower page read 200 that may be performed by the read recovery component 116 of FIG. 1 using binning techniques. As noted, to generate artificial codewords, cells are placed into bins during the sensing process Binning minimizes or otherwise reduces the number of required senses and transfers. Each bin is labeled based on the cell transitions after a given number of reads. In FIG. 2, curved lines 202 denote the threshold voltage (Vt) distributions for various different states (Er and A-G, assuming a known state-by-state distribution). Vertical lines illustrate sense points for different reads. More specifically, solid vertical lines 204 and 206 denote the sense-points used in a first read (Read 1); dashed vertical lines 208 and 210 denote the sense-points used in a second read (Read 2); and dotted vertical lines 212 and 214 denote the sense-points used in a third read (Read 3). The binary read values obtained for the three exemplary reads are labeled, as shown, and may be read from left to right for a particular read, such as "Read 1

Values," which are 1, 0, 0 for Bins 0, 1 and 2, respectively, and "Read 2 Values," which are 1, 1, 0 for Bins 0, 1 and 2.

With three reads, several bins thus may be defined or obtained. Exemplary bins (e.g. Bin 2, Bin 3, etc.) are labelled directly beneath the values associated with the bins. Note that, in this example, Bin 0 corresponds to the region to the left of vertical line 204 (and also the region to the right of vertical line 210) and, as shown, has the values 1, 1, 1 for the three reads. Bin 3 corresponds to the middle region (at the intersection of B and C) and, as shown, has the values 0, 0, 0 for the three reads. The changes (if any) in values within the bins from one read to another are also shown in the figure:

Bin 0: 1→1→1
Bin 1: 0→1→1
Bin 2: 0→0→1
Bin 3: 0→0→0
Bin 4: 0→0→1
Bin 5: 1→→1

Figure 3:
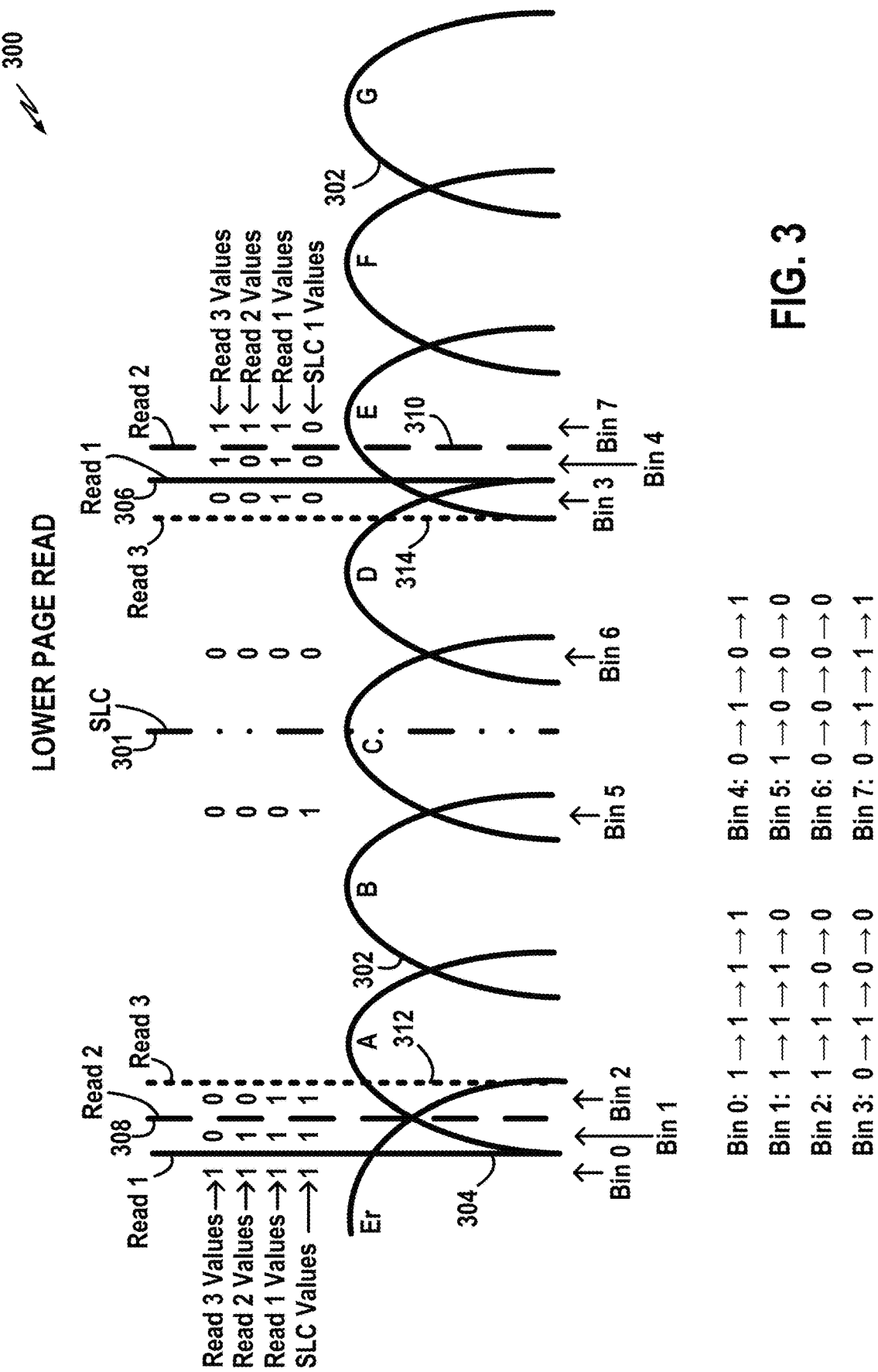
FIG. 3 graphically illustrates another exemplary lower page read that may be performed during read recovery, wherein an initial single-level cell (SLC) read is performed.

In the example of FIG. 2, two of the bins, Bin 0 and Bin 3, contain static bits whose values do not change during all the three reads. The bits in the remaining bins change value based on the read threshold voltage (Vt). These bins are divided into two groups and are used to artificially construct (or reconstruct) codewords using any combination of the three thresholds without requiring additional senses. As noted, after generating artificial codewords, the syndrome weight of each codeword is used to determine if the codeword can be decoded by hard or soft bit decoding. If the codeword syndrome weight is low enough to merit attempting soft decoding, the additional sense points are used to generate soft information for the given soft decoding mode. Note that, in the example of FIG. 2, Bins 2 and 4 are not distinguishable since they have the same values (i.e. 0,0,1). To ensure all bins are distinguishable, a single-level cell (SLC) sense can be performed before all other senses. This is illustrated in FIG. 3. In general, for an N-sense read, a (N−1)-sense read before all additional senses can be used to distinguish bins. That is, for 3-sense read, a 2-sense read can be used to distinguish bins. In other words, for an N-level sense, a single (N−1)-level sense may be performed first to differentiate bins.

FIG. 3 illustrates an exemplary lower page read 300 that may be performed by the read recovery component 116 of FIG. 1 wherein an initial SLC read 301 is performed. Curved lines 302 denote the threshold voltage (Vt) distributions for various different states. Vertical lines again illustrate sense points for different reads. More specifically, dashed-dotted line 301 denotes the sense point for the initial SLC read. Solid vertical lines 304 and 306 denote the sense-points used in a first subsequent read (Read 1); dashed vertical lines 308 and 310 denote the sense-points used in a second read (Read 2); and dotted vertical lines 312 and 314 denote the sense-points used in a third read (Read 3). The binary read values obtained for the four exemplary reads are labeled, as shown, and may be read from left to right for a particular read, such as "SLC values," which are 1, 1, 1 for Bins 0, 1 and 2, "Read 1 Values," which are 1, 1, 1 for Bins 0, 1 and 2, respectively, and "Read 2 Values," which are 1, 1, 0 for Bins 0, 1 and 2.

The SLC read adds two bins, since the left and right sides are now split. The changes (if any) in values within the bins from one read to another are as follows:

Bin 0: 1→1→1→1
Bin 1: 1→1→1→0
Bin 2: 1→1→0→0
Bin3: 0→1→0→0
Bin4: 0→1→0→1
Bin5: 1→0→0→0
Bin6: 0→0→0→0
Bin 7: 0→1→1→1

Hence, in the example of FIG. 3, all bins are distinguishable since each have has distinct values.

Figure 4:
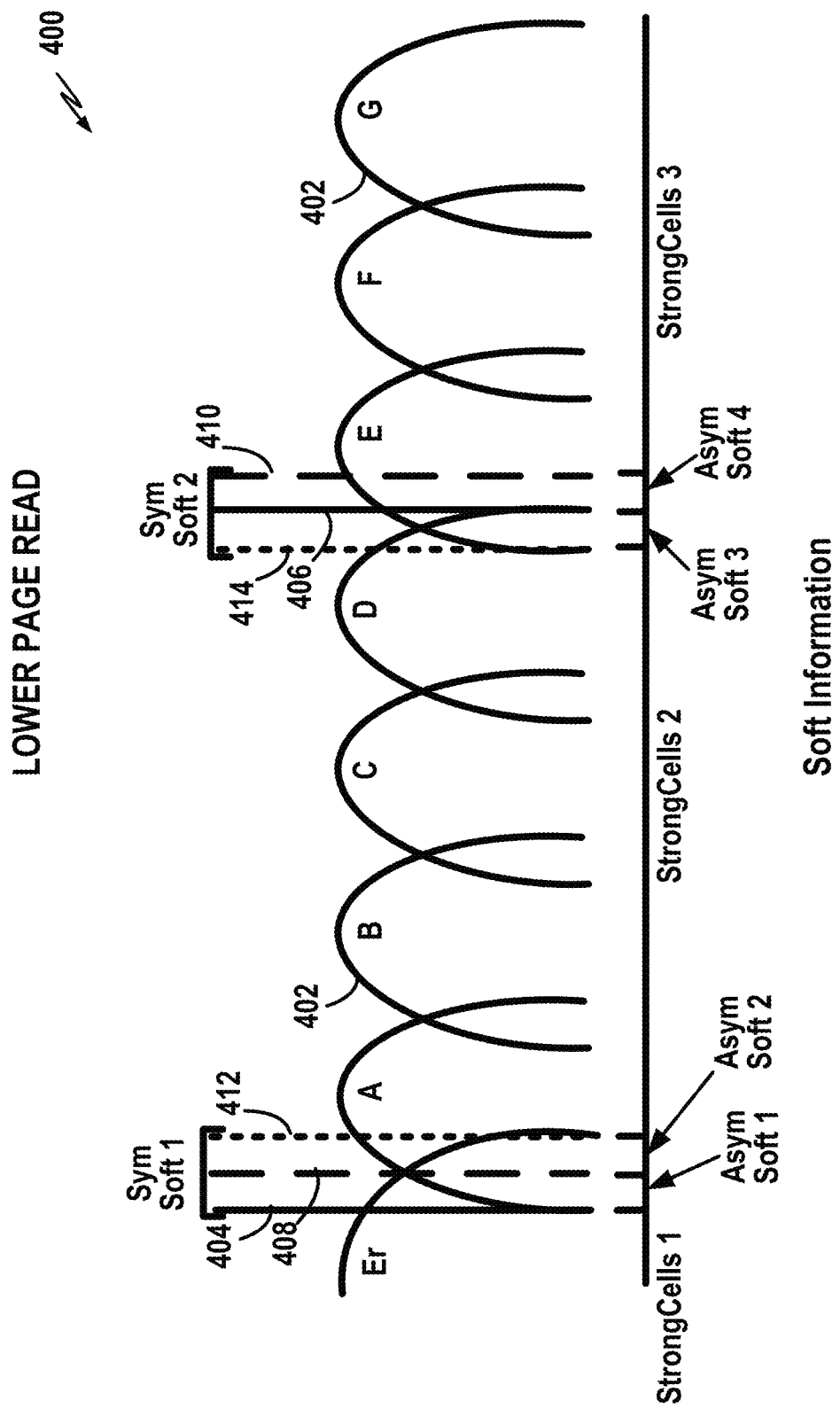
FIG. 4 graphically illustrates different types of soft-bit information that can be extracted from three senses of an exemplary lower page read using binning techniques.

FIG. 4 shows different types of soft-bit information that can be extracted from three senses of an exemplary lower page read 400. As with FIGS. 2 and 3, curved lines 402 denote the threshold voltage (Vt) distributions for the various different states. Vertical lines again denote sense points for different reads. More specifically, solid lines 404 and 406 denote the sense-points used in a first read (Read 1); dashed lines 408 and 410 denote the sense-points used in a second read (Read 2); and dotted vertical lines 412 and 414 denote the sense-points used in a third read (Read 3). In this example, there are four regions with asymmetric soft information (labeled Asym Soft 1-Asym Soft 4) and two regions with symmetric soft information (labeled Sym Soft 1 and Sym Soft 2). Three strong cells are also identified in the figure and are denoted Strong Cell 1, Strong Cell 2, and —Strong Cell 3. In the example of FIG. 4, Read 2 may be used to create asymmetric soft information for Read 1 for both the A and E read levels. Read 3 may then be used with Read 1 on the A-state and Read 3 with Read 2 on the E-state to create symmetric soft information for the Read 2 A-state Read 1 E-state codeword combination. This soft information, when combined with log likelihood ratio table (LLR) information, may increase the strength of the overall decoder.

If the decoding process still fails at soft-bit, another sense plus transfer from the NAND is attempted. Whenever decoding is not successful after a given iteration, the syndrome weight may be used to determine the sense points (sense voltages) for the next read by exploiting a gradient descent process. Herein, "gradient" or "slope" refers to a rate of change in FBC (or corresponding syndrome weight) as a function of a change in the sensing voltage. By way of example, a first sense (Sense 1) is performed at a first sensing voltage (V1) to obtain a first codeword (CW1). The sensing voltage is then increased (or shifted up) by a first step or shift amount ($\Delta 1$) to a second sense voltage (V2) and a second sense (Sense 2) is performed at that voltage to obtain a second codeword (CW2). The syndrome weights (SW1 and SW2) of the two codewords (CW1 and CW2) are determined and, from the syndrome weights, FBC values for the two codewords (FBC1 and FBC2) are estimated. (FBC may be estimated based on syndrome weights by looking up an estimated FBC using a precomputed maximum syndrome weight correction threshold for each decoder.) If FBC2 is lower than FBC1, then the shift ($\Delta 1$) was in the correct direction (up) because the shift achieved a reduction in FBC. That is, the direction (or directionality) of the shift was correct and the next shift should be in the same direction. If FBC2 is higher than FBC1, then the shift ($\Delta 1$) was in the wrong direction and the next shift should be in the opposite direction (i.e. down rather than up).

Assuming the first shift was in the correct direction, the gradient in FBC is determined from FBC1, FBC2, V1 and V2 by, for example, calculating Gradient=(FBC2−FBC1)/(V2−V1). (Alternatively, the syndrome weight gradient may be used rather than an FBC gradient.) If this gradient value is relatively small, that means that the initial step size ($\Delta 1$) did not achieve a significant reduction in FBC and so the step size for the next sense ($\Delta 2$) should be increased significantly to "coarsely tune" the sensing voltage. Otherwise, if the gradient value is relatively large, the initial step size ($\Delta 1$) achieved a significant reduction in FBC, and so the step size for the next sense (Δ2) may be reduced to "fine tune" the sensing voltage. In either case, an appropriate adjustment in step size is then made to determine the sense voltage (V3) to use in the next sense and another sense (S3) is performed at the new voltage (V3). A third codeword (CW3) is obtained, its FBC is estimated (e.g. FBC3) and a new estimate of the gradient is made, from which further adjustments in step size and directionality are made. In this manner, the processor attempts to fine tune the sense voltage to obtain optimal codewords that have minimal syndrome weights and minimal FBCs. As the processor "zeros in" on an optimal sense voltage, the gradient is expected to decrease or "decay" (with small step size adjustments yielding small changes in gradient near the optimal sense voltage).

This overall procedure to adjust sense voltages may be referred to as an FBC gradient descent or gradient decay process. Since FBC is derived from syndrome weight, the procedure may also be referred to as a syndrome weight gradient descent or decay process. The process may be repeated until a codeword is successfully decoded or until some other termination criteria is met, such as if the number of senses is too high or the rate of FBC or syndrome weight decay is too low (indicating that further changes are not likely to achieve meaningful results). Note that what is considered a relatively small or a relatively large change in a parameter (such as a change in the FBC) may be determined or assessed based on suitable predetermined or adjustable threshold values, which may differ from one system to another.

Figure 5:
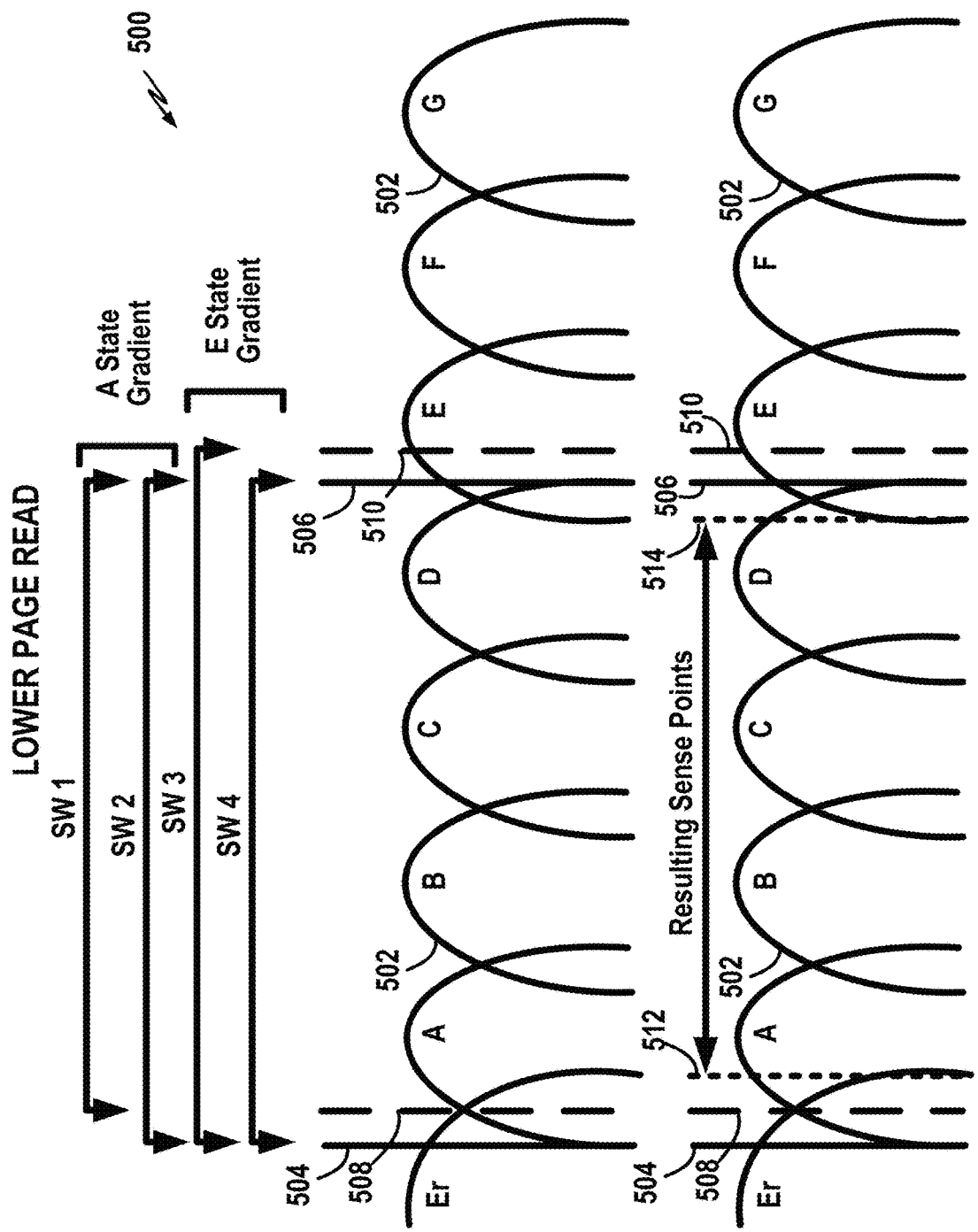
FIG. 5 graphically illustrates a lower page read example in which a syndrome weight gradient (or FBC gradient) is generated with three reads.

FIG. 5 illustrates an example of generating a syndrome weight gradient (or FBC gradient) with three reads. Curved lines 502 denote the threshold voltage (Vt) distributions for the various different states. Vertical lines again denote sense points for different reads. More specifically, solid lines 504 and 506 denote the sense-points used in a first read (Read 1); dashed lines 508 and 510 denote the sense-points used in a second read (Read 2); and dotted vertical lines 512 and 514 denote the sense-points used in a third read (Read 3). Note that the dotted lines representing Read 3 are shown only among the lower set of curved voltage threshold lines 502 to highlight that Read 3 is an additional read with sense points determined based on gradient values obtained from the first two reads. Note also that the optimal sense points are A-state Read 2 and E-State Read 1 as those points are closest to the valley between states.

The lines at the top of FIG. 5 identify the two sense points used for each syndrome weight calculation from the first two senses and the resulting third sense. The first read points (504, 506) are at default read levels. The second read points (508, 510) are shifted to the right (i.e. up) from Read 1 by default (or shifted to the left in other examples). The syndrome weights for the artificial codewords generated from these two reads (syndrome weights SW 1 through SW 4 in the figure) indicate that the syndrome weight decreased for Read 2 A-state (i.e. SW 1<SW 2) and the syndrome weight increased for Read 2 E-State (i.e. SW 3>SW 4). The third sense (i.e. Read 3) then follows the syndrome weight gradient reading to the right of Read 2 for the A-state (i.e. sense point 512) and to the left of Read 1 for the E-State (i.e. sense point 514). The step size for the shift may be preprogrammed and then adaptively adjusted. The syndrome weights may be stored and reused to facilitate decoding for future reads.

To summarize, a procedure or mechanism is provided that allows a processor to artificially combine read level senses to generate decodable codewords without requiring an additional sense. If there are two lower page reads (A/E read levels read twice), the processor can combine these levels to generate four codewords, instead of just the two codewords that would otherwise be available, and to then read the syndrome weight from each. This also allows the processor to calculate an optimal (or at least beneficial) threshold shift for each threshold independently. As noted, the gains from this procedure increase with the number of read levels, so with four read levels (X4), assuming four read thresholds, two reads generate 2*2*2*2=16 codewords. (See, above, for additional details of the exponential increase in codewords.) The binning mechanism allows the processor to search for an optimal codeword without additional senses (as well as to generate directionality for a next read per threshold).

Figure 6:
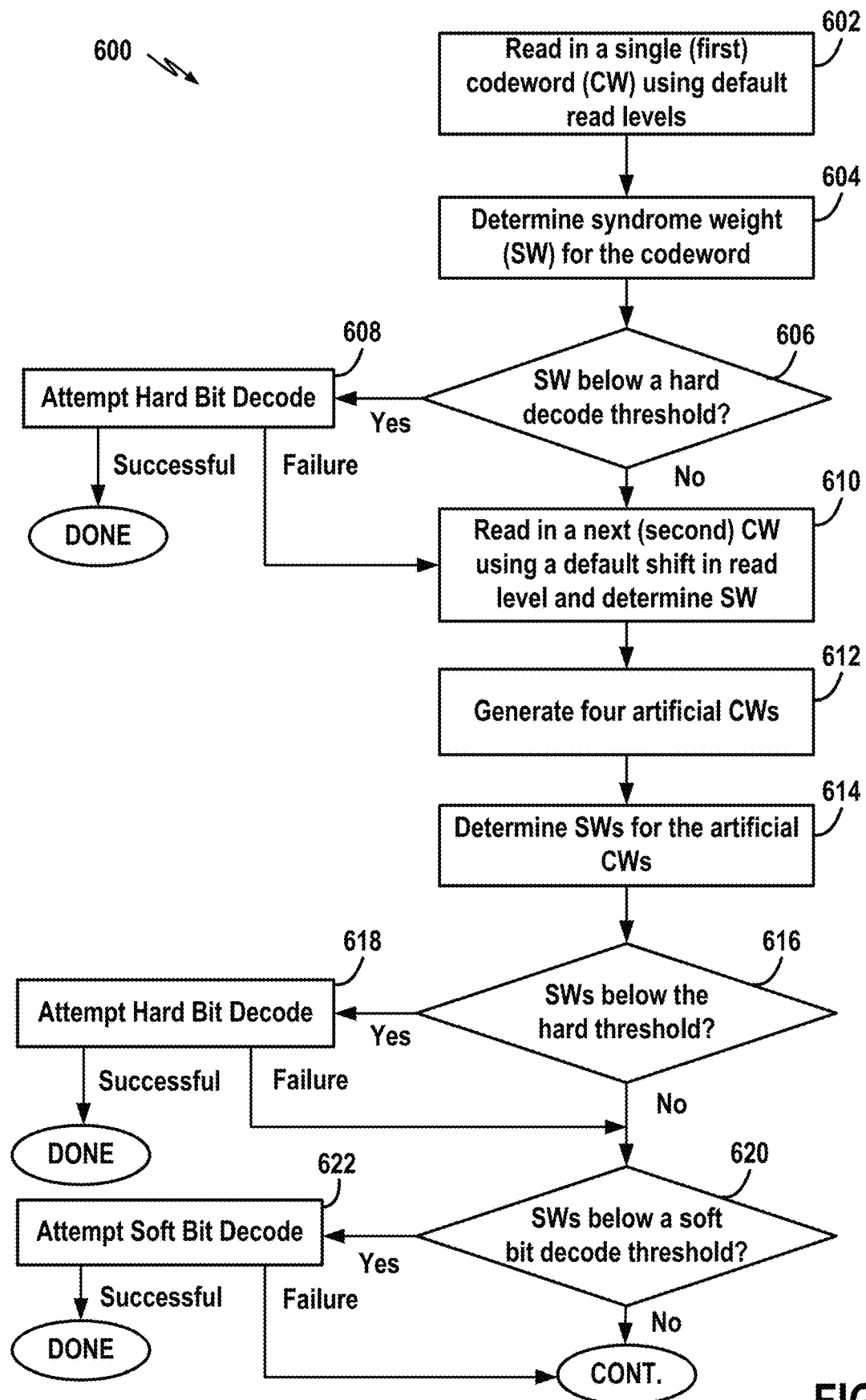
FIGS. 6 and 7 illustrate an exemplary iterative read recovery process.
Figure 7:
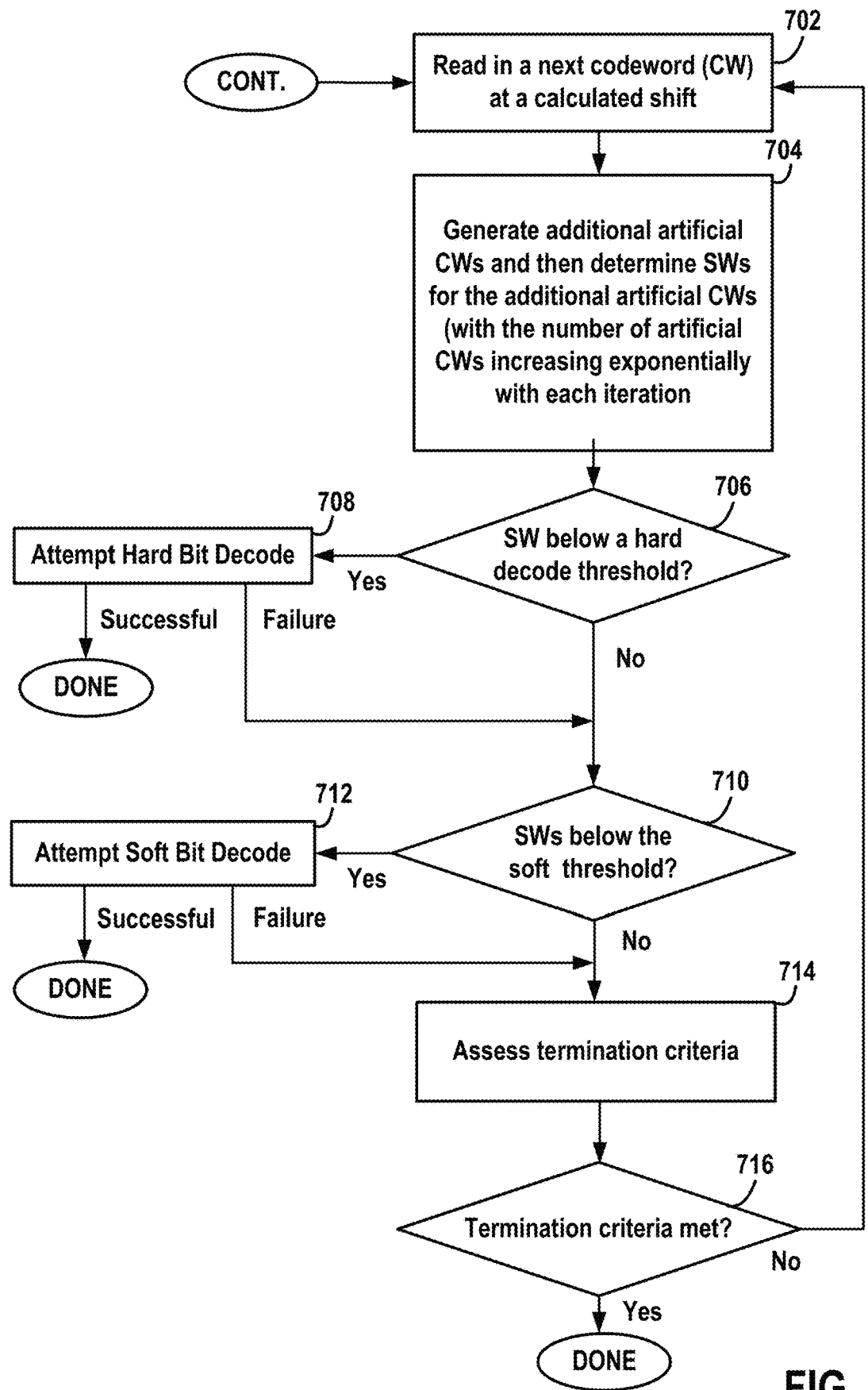

FIGS. 6 and 7 illustrate an exemplary complete read recovery process 600, which combines the procedures discussed above. Briefly, a first step in the process of FIGS. 6 and 7 is the sense plus transfer of a codeword, then the syndrome weight is calculated for this codeword. If the syndrome weight is low enough, hard decode is attempted. If the syndrome weight is too high, or if the hard decode ends in failure, the next codeword is sensed at the default level. From these two senses, four codewords are generated using the artificial codeword generation process described above. (See, above, for additional details of the exponential increase in codewords.) The syndrome weight is calculated for all of these codewords. If the minimum syndrome weight of the four codewords is less than the hard decode or soft decode thresholds, hard or soft decode is attempted respectively. If hard/soft decode fails or is never attempted, another codeword is read using syndrome weight gradient information and the process starts over until successful termination or a predetermined set of termination criteria is triggered (such as to stop after N number of iterations or after X amount of time). As already mentioned, if the read recovery terminates without a successful decode, the system may proceed to a XOR-based erasure code procedure.

More specifically, beginning at 602 of FIG. 6, the processor performing the read recovery procedure reads in a single (first) codeword (CW) using default read levels (i.e. the processor performs a first sense operation) and, at 604, determines the syndrome weight for the codeword. If, within decision block 606, the processor determines that the syndrome weight is below a hard bit decode threshold, the processor attempt a hard bit decode, at 608, using a hard bit decoder. If successful, the read recovery is complete. That is, the data has been successfully read out and can be forwarded to the requesting host device (often along with other data). If the hard bit decode of 608 failed, or if the procedure was not attempted because the syndrome weight was too high, then, at 610, the processor reads in a next (second) codeword (i.e. the processor performs a first sense operation) using a default shift in read level (as discussed above) and determines the syndrome weight of the second codeword. At 612, the processor generates four artificial codewords from the information obtained while reading in the first and second codewords (e.g. by generating an artificial code using: RD1 AR3+RD1 ER3, RD1 AR3+RD2 ER3, RD2 AR3+RD1 ER3, RD2 AR3+RD2 ER3).

At 614, the processor determines syndrome weights for each of the four artificial codewords. If, within decision block 616, the processor determines that at least one of the syndrome weights is below the hard bit decode threshold, then the artificial codeword having the lowest syndrome weight is applied to the hard bit decoder, at 618, in an attempt to decode that codeword. This particular codeword may be referred to as the optimal codeword of the group, as it has the lowest syndrome weight. If an artificial codeword is successfully decoded at 618, the procedure is complete. Otherwise, the syndrome weights for the artificial codewords are compared to a soft bit decode threshold. If within decision block 620, the processor determines that at least one of the syndrome weights is below the soft bit decode threshold, the artificial codeword having the lowest syndrome weight is applied to the to the soft bit decoder, at block 622, in an attempt to decode the codeword. At block 622, the soft bit decoding may use asymmetric soft bit information generated from the first two senses (i.e. the first sense of block 602 and the second sense of block 610). If an artificial codeword is successfully decoded at block 622, the procedure is complete. Otherwise, processing proceeds to FIG. 7.

At block 702 of FIG. 7, the processor reads in a next codeword (i.e. the processor performs another hard sense operation) at a calculated shift by shifting the sense points as shown in FIG. 5 relative to previous levels. At block 704, the processor generates additional artificial codewords and then determines syndrome weights for the additional artificial codewords (with the number of artificial codewords increasing exponentially (or geometrically) with each iteration of the procedure, as already explained). Also in block 704, the processor determines syndrome weights for each of the new artificial codewords. If, within decision block 706, the processor determines that at least one of the syndrome weights is below the hard bit decode threshold, then the artificial codeword having the lowest syndrome weight (which again may be referred to as an optimal codeword) is applied to the hard bit decoder, at block 708, in an attempt to decode that codeword. If an artificial codeword is successfully decoded at block 708, the procedure is complete. Otherwise, the syndrome weights for the new artificial codewords are compared to a soft bit decode threshold. If, within decision block 706, the processor determines that at least one of the syndrome weights is below the soft bit decode threshold, the artificial codeword having the lowest syndrome weight is applied to the soft bit decoder, at block 712, in an attempt to decode the codeword. At block 712, the soft bit decoding may use symmetric soft bit information generated from the first three senses (i.e. the first sense of block 602, the second sense of block 610, and the third sense of block 702).

If an artificial codeword is successfully decoded at block 712, the procedure is complete. Otherwise, processing proceeds to block 714, where the processor assesses the pre-programmed termination criteria to determine if the processor should end the read recovery procedures of FIGS. 6 and 7 and proceed to other procedures. As noted above, the termination criteria might specify a maximum number of iterations. In other examples, the procedure is terminated based on the aforementioned gradient. That is, the rate of decrease (if any) in either syndrome weight or FBC is determined and compared again a decay rate threshold. If the rate is too slow (indicating that further adjustments in the sense point will not likely produce new codewords that have low syndrome weights), the procedure is terminated.

Assuming, however, that the termination criteria is not yet met, the processor returns to block 702 to read in yet another codeword at a calculated shift value. The procedures of blocks 704-714 are then iteratively repeated. As already explained, an exponentially increasing number of artificial codewords are generated for each new iteration, thus increasing the chances of decoding one of them (particularly since each new shift value can be adaptively or intelligently selected based on the syndrome weight gradient). If, however, the termination criteria of block 716 are reached without successfully decoding any of the codewords, the read recovery procedures of FIGS. 6 and 7 are ended and the processor proceeds to other procedures, such as a XOR-based erasure code procedure.

In this manner, a read recovery procedure is provided that combines established techniques (such as hard bit decodes and soft bit decodes) to increase or maximize the probability of successfully decoding after each step while also reducing or minimizing data senses and transfers to/from the NAND. Thus, among other advantages, the read recovery systems and procedures described herein may provide for: reduced recovery latency; a simplified read retry flow that includes both optimal read level search and soft-bit decoding in the same module (as opposed to multiple modules) thus reducing firmware complexity; and reduced NAND senses/transfers that may provide better overall system SSD performance In the following section, an exemplary NVM embodiment will be described in greater detail. To provide a concrete example, many details of a particular NVM system are provided, but it should be understood that the read recovery procedures described herein may be implemented in a wide range of devices for a wide range of applications.

Exemplary Non-Volatile Memory (NVM) System

Figure 8:
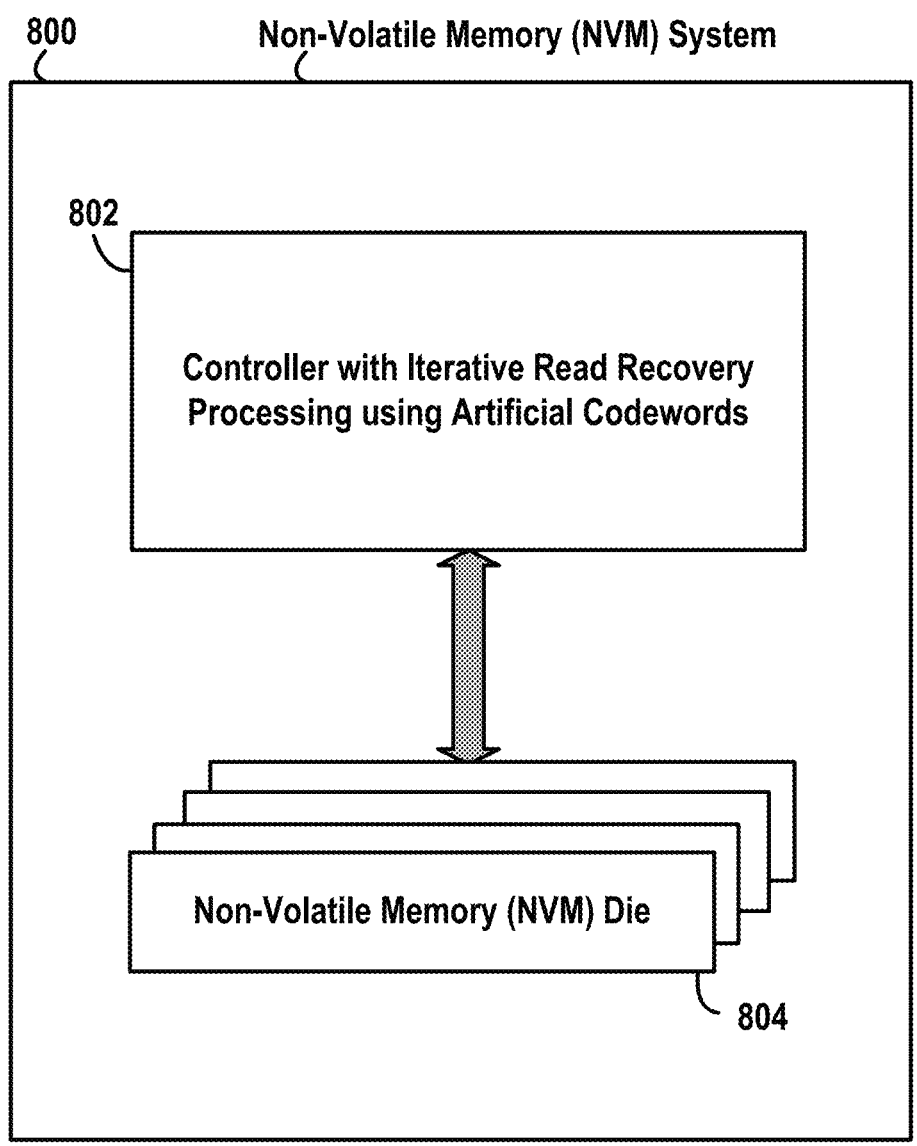
FIG. 8 is a block diagram illustrating an exemplary NVM system having a controller configured for iterative read recovery processing using artificial codewords.
Figure 9:
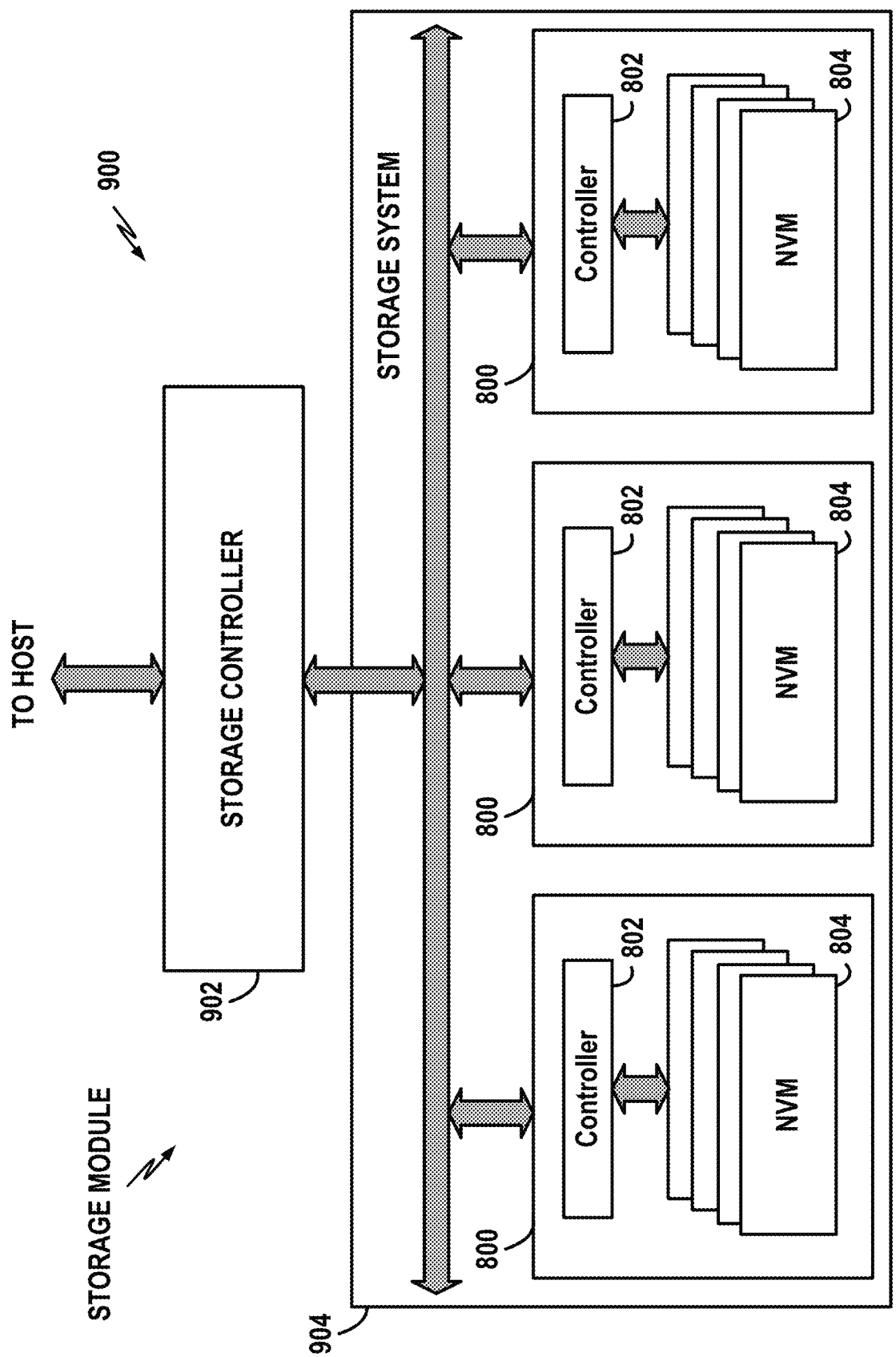
FIG. 9 is a block diagram illustrating an exemplary storage module with multiple NVM systems each having a controller configured for iterative read recovery processing using artificial codewords, as in FIG. 8.
Figure 10:
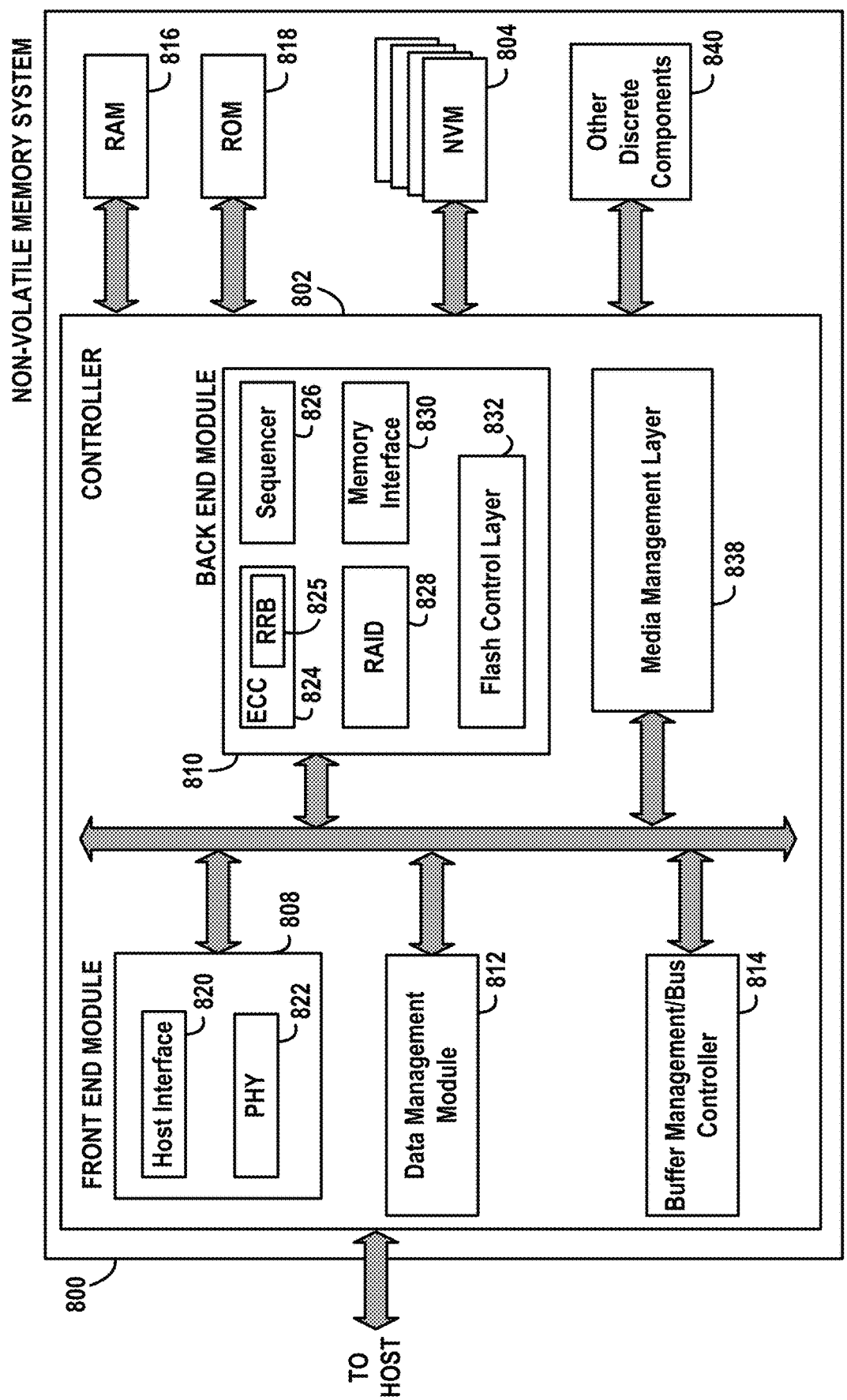
FIG. 10 is a block diagram illustrating exemplary components of the controller of the NVM system of FIG. 8.

FIGS. 8-10 illustrate and summarize various selected features of an exemplary NVM system in which the above-described read recovery procedures may be implemented.

Briefly, FIG. 8 is a block diagram illustrating an exemplary NVM system 800 in which the various systems and methods disclosed herein may be used. The NVM system 800 includes a controller 802 configured for iterative read recovery processing using artificial codewords (and having, for example, the aforementioned RRB module). Controller 802 interfaces with a host system or device (such as the host device shown in FIG. 1) and transmits command sequences for read, program, and erase operations to an NVM die 804. As used herein, the term die may refer to the set of NVM cells, and the associated circuitry for managing the physical operation of the NVM cells, that are formed on a single semiconductor substrate.

The controller 802 (which may be a flash memory controller) can take the form of processing circuitry, a microprocessor or processor, and/or a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 802 can be configured with hardware and/or firmware to perform the various functions described herein and shown in the flow diagrams. Also, some of the components shown as being internal to the controller can also be stored external to the controller, and other components can be used. Additionally, the phrase "operatively in communication with" can mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have functionality in addition to the specific functionality described herein. For example, the flash memory controller can format the flash memory to ensure the memory is operating properly, map bad flash memory cells, and allocate spare cells to be substituted for future failed cells. Some portion of the spare cells can be used to hold firmware to operate the flash memory controller and implement other features. In operation, when a host needs to read data from or write data to the flash memory, it communicates with the flash memory controller. If the host provides a logical address to which data is to be read/written, the flash memory controller converts the logical address received from the host to a physical address in the flash memory. (Alternatively, the host can provide the physical address). The flash memory controller can also perform various memory management functions, such as wear leveling (i.e. distributing writes to avoid wearing out specific blocks of memory that would otherwise be repeatedly written to) and garbage collection (i.e. after a block is full, moving only valid pages of data to a new block, so the full block can be erased and reused).

An NVM die 804 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion (as will be discussed further below).

The interface between controller 802 and NVM die 804 may be any suitable flash interface, such as a suitable toggle mode. In one embodiment, memory system 80 may be a card-based system, such as a secure digital (SD) or a micro secure digital (micro-SD) card. In an alternate embodiment, memory system 800 may be part of an embedded memory system.

Although, in the example illustrated in FIG. 8, NVM system 800 includes a single channel between controller 802 and NVM die 804, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 802 may be implemented in a single integrated circuit chip and may communicate with different layers of memory in the NVM die 804 over one or more command channels.

FIG. 9 illustrates a storage module 900 that includes plural NVM systems 800. As such, storage module 900 may include a main storage controller 902 that interfaces with a host and with a storage system 904, which includes a plurality of NVM systems 800. The interface between storage controller 902 and NVM systems 800 may be a bus interface, such as a serial advanced technology attachment (SATA) or peripheral component interface express (PCIe) interface. Storage module 900, in one embodiment, may be a solid state drive (SSD), such as found in portable computing devices, such as laptop computers, and tablet computers.

FIG. 10 is a block diagram illustrating exemplary components of controller 802 of FIG. 8 in more detail. Controller 802 includes a front end module 808 that interfaces with a host, a back end module 810 that interfaces with the one or more NVM die 804, and various other modules that perform functions which will be described below. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 802 may include a data management module 812 present on the die of the controller 802. The data management module 812 handles the scheduling of maintenance and host write operations in a schedule cycle for the NVM such that the schedule cycle balances consumption of space with creation of free space. In embodiments having a NVM with a plurality of NVM die, the NVM die may be operated asynchronously and independently such that multiple NVM die may concurrently have schedule cycles balancing consumption and creation of free space in each respective NVM die. The data management module 812 may include one or more die managers, not separately shown.

Referring again to modules of the controller 802, a buffer manager/bus controller 814 manages buffers in random access memory (RAM) 816 and controls the internal bus arbitration of controller 802. A read only memory (ROM) 818 stores system boot code. Although illustrated in FIG. 10 as located separate from the controller 802, in other embodiments one or both of the RAM 816 and the ROM 818 may be located within the controller. In yet other embodiments, portions of RAM and ROM may be located both within the controller 802 and outside the controller 802. Further, in some implementations, the controller 802, RAM 816, and ROM 818 may be located on separate semiconductor die.

Front end module 808 includes a host interface 820 and a physical layer interface (PHY) 822 that provide the electrical interface with the host or next level storage controller. The choice of the type of host interface 820 can depend on the type of memory being used. Examples of host interfaces 820 include, but are not limited to, SATA, SATA Express, SAS, Fibre Channel, USB, PCIe, and NVMe. The host interface 820 typically facilitates transfer for data, control signals, and timing signals.

Back end module 810 includes an error correction controller (ECC) engine 824 that encodes the data bytes received from the host, and decodes and error corrects the data bytes read from the NVM. The ECC engine 824 includes a read recovery in a box (RBB) engine or module 825 that performs the read recovery procedures described above. That is, the RBB engine 825 provides for the aforementioned iterative read recovery processing using artificial codewords. A command sequencer 826 generates command sequences, such as program and erase command sequences, to be transmitted to NVM die 804. A RAID (Redundant Array of Independent Drives) module 828 manages generation of RAID parity and recovery of failed data. The RAID parity may be used as an additional level of integrity protection for the data being written into the memory die 804. In some cases, the RAID module 828 may be a part of the ECC engine 824. A memory interface 830 provides the command sequences to NVM die 804 and receives status information from NVM die 804. In one embodiment, memory interface 830 may be a double data rate (DDR) interface. A flash control layer 832 controls the overall operation of back end module 810.

Additional components of system 800 illustrated in FIG. 10 include media management layer 838, which performs wear leveling of memory cells of NVM die 804. System 800 also includes other discrete components 840, such as external electrical interfaces, external RAM, resistors, capacitors, or other components that may interface with controller 802. In alternative embodiments, one or more of the physical layer interface 822, RAID module 828, media management layer 838 and buffer management/bus controller 814 are optional components that are not necessary in the controller 802.

Figure 11:
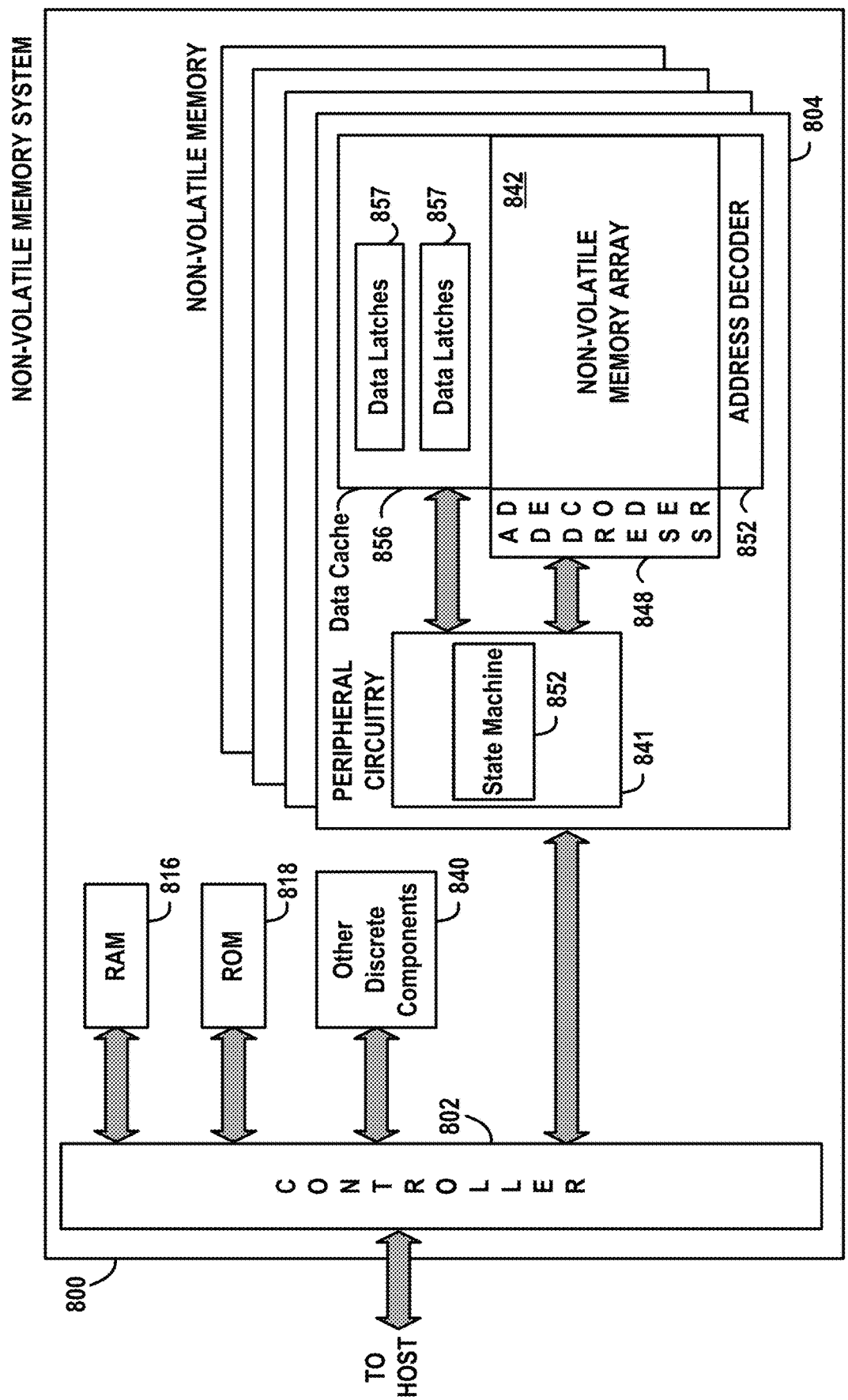
FIG. 11 is a block diagram illustrating exemplary components of the NVM of the NVM system of FIG. 8.

FIG. 11 is a block diagram illustrating exemplary components of NVM die 804 in more detail. NVM die 804 includes peripheral circuitry 841 and NVM array 842. NVM array 842 includes the NVM cells (not individually shown) used to store data. The NVM cells may be any suitable NVM cells, including NAND flash memory cells and/or NOR flash memory cells in a two dimensional and/or three dimensional configuration. Peripheral circuitry 841 includes a state machine 852 that provides status information to controller 802. NVM die 804 further includes a data cache 856 that caches data. The data cache comprises sets of latches 857 for each bit of data in a memory page of the NVM array 842. Thus, each set of latches 857 is a page in width and a plurality of sets of latches 857 may be included in the data cache 856.

Further Exemplary Embodiments

FIGS. 12-16 and summarize various general features of exemplary data storage controllers and methods, or procedures for use with data storage controllers.

Figure 12:
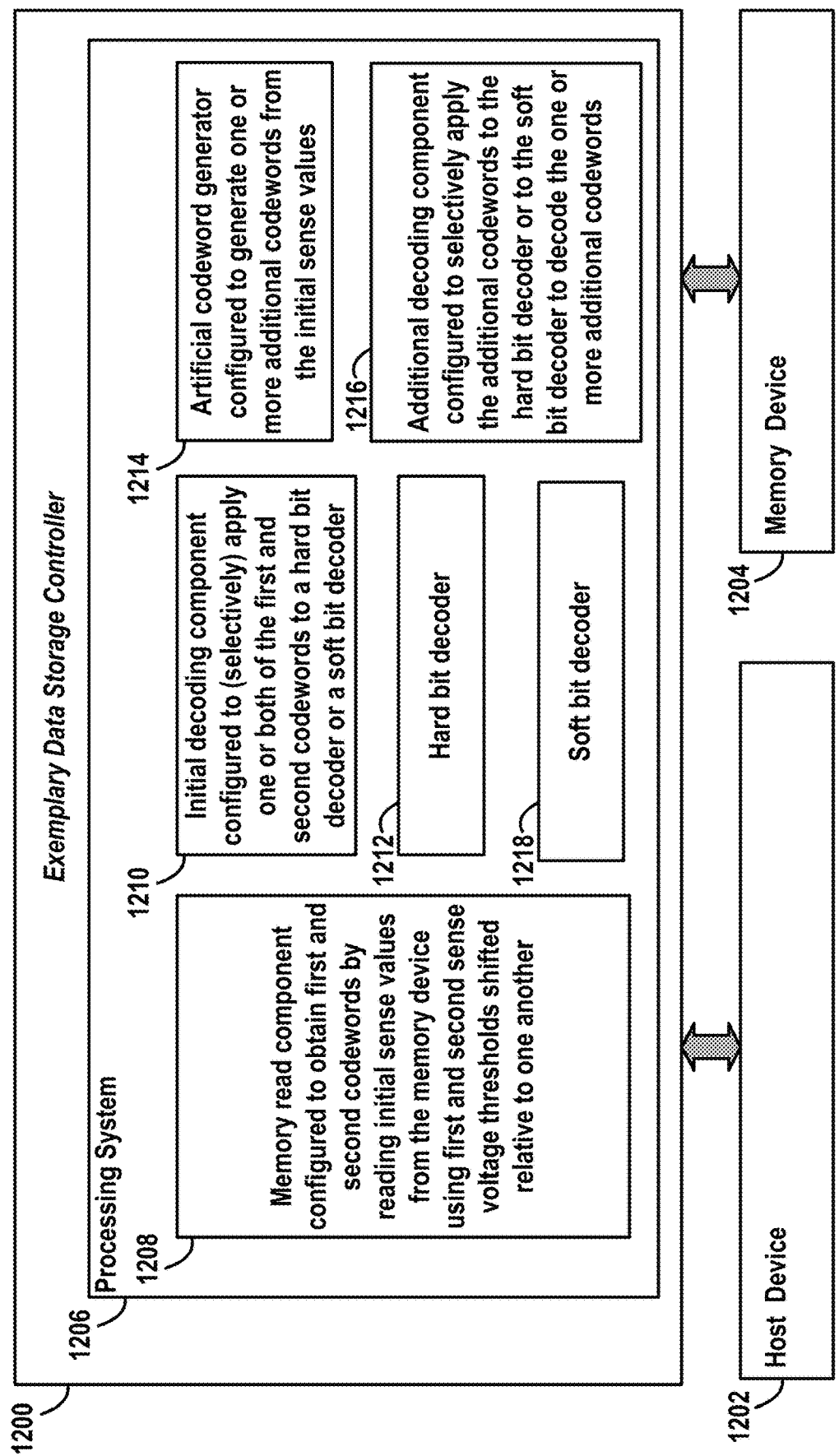
FIG. 12 is a block diagram summarizing selected features of an exemplary data storage controller equipped for iterative read recovery processing using artificial codewords.

FIG. 12 shows an exemplary data storage controller 1200 (or memory controller) configured to communicate with a host device 1202 and a data storage device or memory device 1204. Although many examples described herein relate to NVM controllers for storing data within NAND devices, the memory device 1204 may be any suitable memory or storage device and is not limited to NANDs, and the data storage controller 1200 may be any suitable memory controller device and is not limited to NAND-based controllers.

The exemplary data storage controller 1200 of FIG. 12 includes a processor 1206 for controlling storage, retrieval and/or erasure of data within the memory device 1204 and for controlling the delivery of data values read from the memory device 1204 to the host device 1202. The exemplary processor 1206 includes a memory read component 1208 configured to obtain first and second codewords by reading initial sense values from the memory device 1204 using first and second sense voltage thresholds shifted relative to one another. The processor 1206 also includes an initial decoding component 1210 configured to (selectively) apply one or both of the first and second codewords to a hard bit decoder 1212 or a soft bit decoder 1218. (By "selectively," it is meant that the processor may choose to apply one or the other or both of the codewords to either the hard bit decoder, the soft bit decoder, or both decoders, based on the programming of the processor. By a hard bit decoder "or" a soft bit decoder, a non-exclusive "or" is intended. That is, the processor may apply a particular codeword to either the hard bit decoder, the soft bit decoder, or both decoders.) The processor 1206 also includes an artificial codeword generator 1214 configured to generate one or more additional codewords from the initial sense values (obtained by memory read component 1208) and an additional decoding component 1216 configured to (selectively) apply the additional codewords to the hard bit decoder 1212 or to the soft bit decoder 1218 to decode the one or more additional codewords. Each of the components shown within processing system 1208 in FIG. 12 may be configured within a single Read Recovery in a Box (RRB) module, as discussed above.

In at least some examples, means may be provided for performing the functions illustrated in FIG. 12 and/or other functions illustrated or described herein. For example, an apparatus (e.g. processing system 1106) may be provided for use with a data storage device (e.g. memory device 1104) where the apparatus includes: means (such as component 1208) for obtaining first and second codewords by reading initial sense values from a memory device using first and second sense voltage thresholds shifted relative to one another; means (such as component 1210) for applying one or both of the first and second codewords to a hard bit decoder; means (such as component 1214) for generating one or more additional codewords from the initial sense values; and means (such as component 1216) for applying the one or more additional codewords to the hard bit decoder or to a soft bit decoder to decode the one or more additional codewords. These are just some exemplary means.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

In at least some examples, a machine-readable storage medium may be provided having one or more instructions which when executed by a processing circuit causes the processing circuit to performing the functions illustrated in FIG. 12 and/or other functions illustrated or described herein. For example, instructions may be provided for: obtaining first and second codewords by reading initial sense values from a memory device using first and second sense voltage thresholds shifted relative to one another; applying one or both of the first and second codewords to a hard bit decoder; generating one or more additional codewords from the initial sense values; and applying the one or more additional codewords to the hard bit decoder or to a soft bit decoder to decode the one or more additional codewords. These are just some exemplary instructions.

Figure 13:
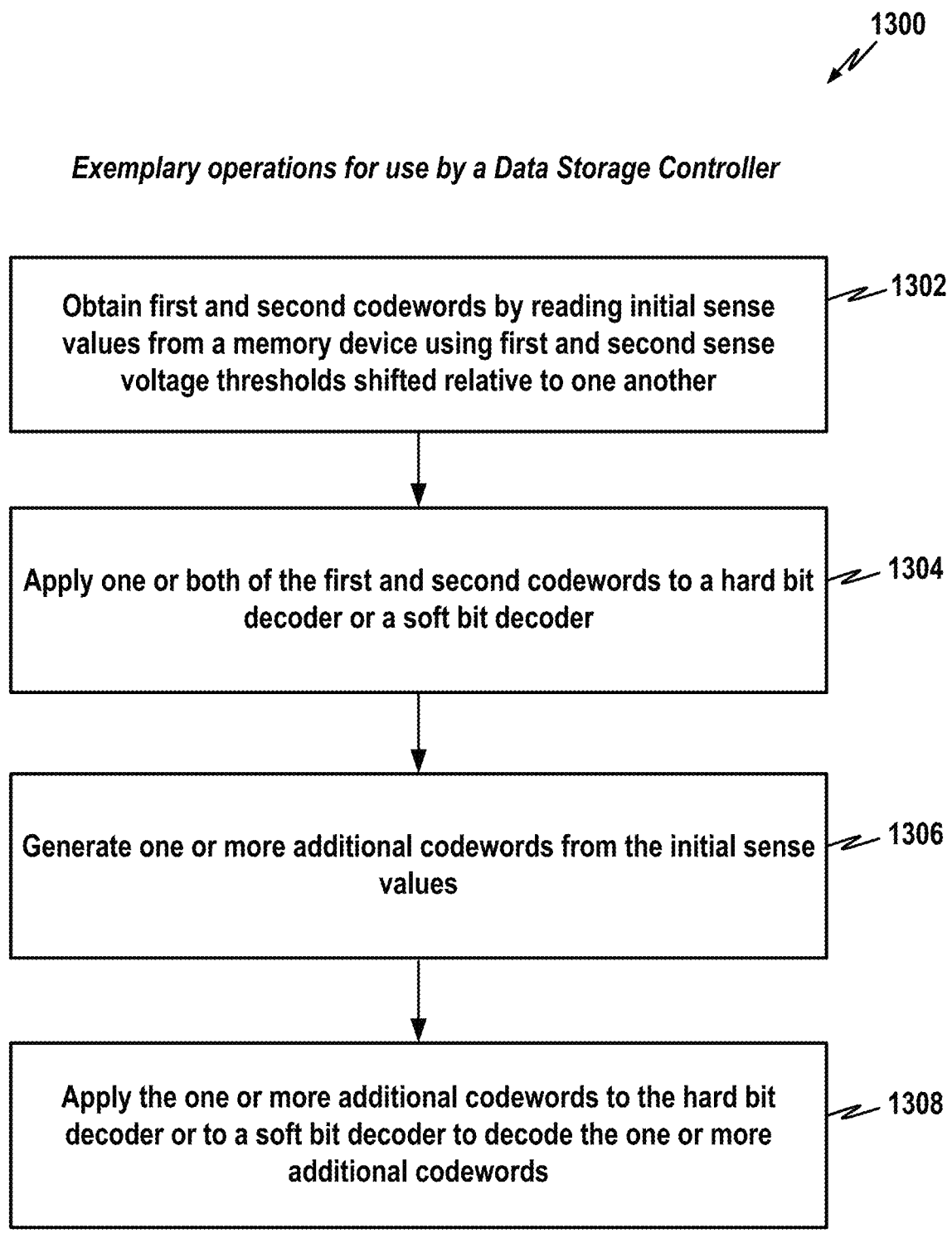
FIG. 13 is a high-level flow chart summarizing exemplary operations for use by a data storage controller.

FIG. 13 broadly summarizes exemplary operations 1300 for use by or with a data storage controller or other suitable device to decode codewords. These and other operations may be performed by the aforementioned RRB component. At 1302, the data storage controller obtains first and second codewords by reading initial sense values from a memory device using first and second sense voltage thresholds shifted relative to one another. At 1304, the data storage controller (selectively) applies one or both of the first and second codewords to a hard bit decoder or a soft bit decoder. At 1306, the data storage controller generates one or more additional codewords from the initial sense values. At 1308, the data storage controller (selectively) applies the one or more additional codewords to the hard bit decoder or to the soft bit decoder (in an attempt) to decode the one or more additional codewords. This various procedures were described in detail above.

Figure 14:
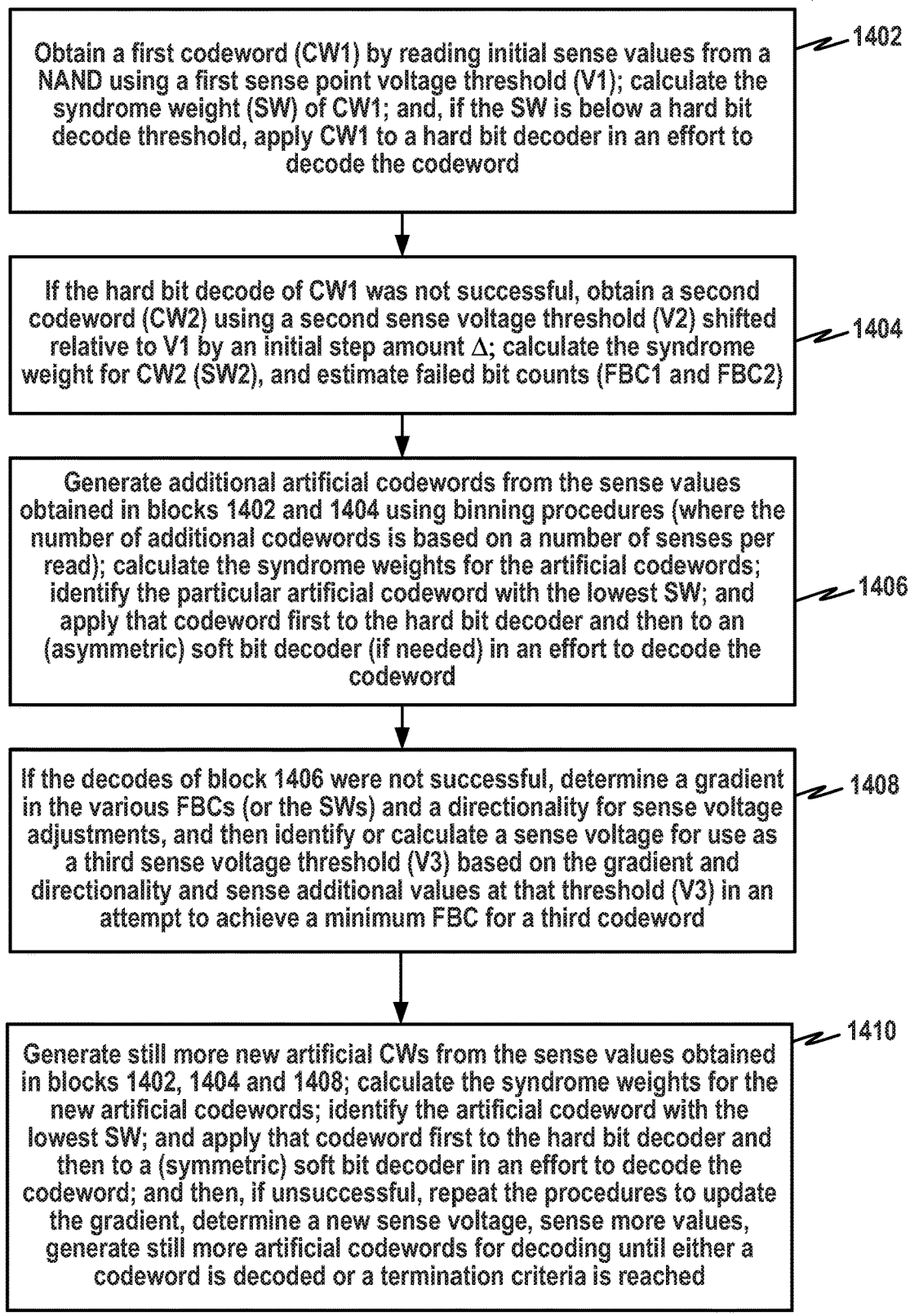
FIG. 14 is a high-level flow chart summarizing further exemplary operations for use by a data storage controller.

FIG. 14 further summarizes exemplary operations 1400 for use by or with a data storage controller or other suitable device. At 1402, the data storage controller obtains a first codeword (CW1) by reading initial sense values from a NAND using a first sense point voltage threshold (V1); calculates the syndrome weight (SW) of CW1; and, if the SW is below a hard bit decode threshold, applies CW1 to a hard bit decoder in an effort to decode the codeword. At 1404, if the hard bit decode of CW1 was not successful, the data storage controller obtains a second codeword (CW2) using a second sense voltage threshold (V2) shifted relative to V1 by an initial step amount 4; calculates the syndrome weight for CW2 (SW2), and estimates failed bit counts (FBC1 and FBC2). At 1406, the data storage controller generates additional artificial codewords from the sense values obtained in blocks 1402 and 1404 using the binning procedures described above (wherein the number of additional codewords is based on a number of senses per read); calculates the syndrome weights for the artificial codewords; identifies the particular artificial codeword with the lowest SW; and applies that codeword first to the hard bit decoder and then to a soft bit decoder (if needed) in an effort to decode the codeword. The soft bit decoder may use asymmetric soft bit information in this stage.

At 1408, if the decodes of block 1406 were not successful, the data storage controller determines a gradient in the various FBCs (or the SWs) and a directionality for sense voltage adjustments, and then identifies or calculates a sense voltage for use as a third sense voltage threshold (V3) based on the gradient and directionality and sense additional values at that threshold (V3) in an attempt to achieve a minimum FBC for a third codeword. At 1410, the data storage controller generates still more new artificial CWs from the sense values obtained in blocks 1402, 1404 and 1408 (e.g. nine new codewords); calculates the syndrome weights for the new artificial codewords; identifies the artificial codeword with the lowest SW; and applies that codeword first to the hard bit decoder and then to a soft bit decoder (if needed) in an effort to decode the codeword. The soft bit decoder may use symmetric soft bit information in this and subsequent stages. If the decoding is still unsuccessful, the data storage controller repeats the procedures to update the gradient, determine a new sense voltage, sense more values, generate still more artificial codewords for decoding, until either a codeword is decoded or a termination criteria is reached, as discussed above.

Figure 15:
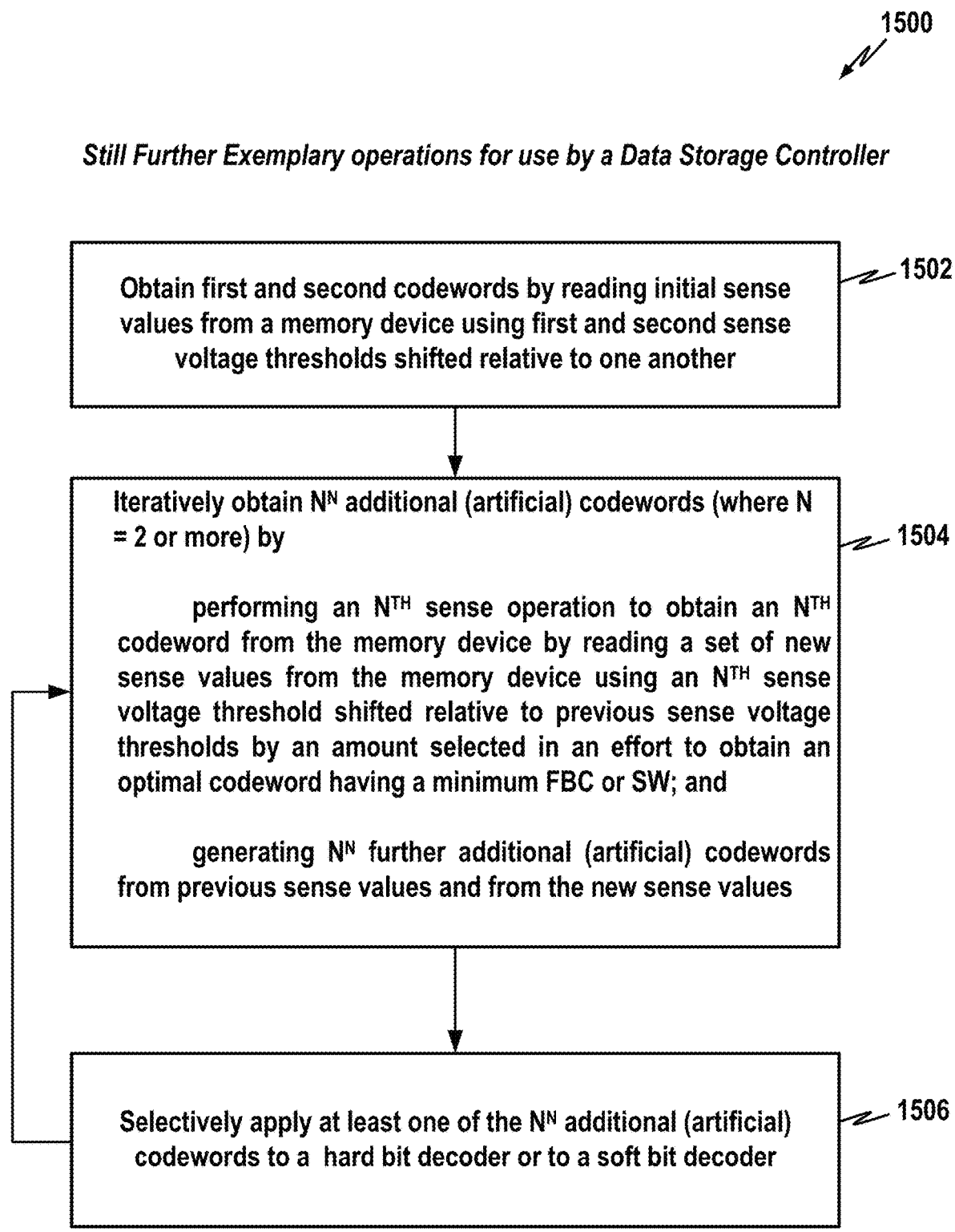
FIG. 15 is a high-level flow chart summarizing still further exemplary operations for use by a data storage controller.

FIG. 15 summarizes still further exemplary operations 1500 for use by or with a data storage controller or other suitable device, particularly highlighting iterative aspects of the decoding procedure. At 1502, the data storage controller obtains first and second codewords by reading initial sense values from a memory device using first and second sense voltage thresholds shifted relative to one another. At 1504, the data storage controller iteratively obtains $N^N$ additional (artificial) codewords (where N=2 or more) by: performing an $N^{TH}$ sense operation to obtain an $N^{TH}$ codeword from the memory device by reading a set of new sense values from the memory device using an $N^{TH}$ sense voltage threshold shifted relative to previous sense voltage thresholds by an amount selected in an effort to obtain an optimal codeword having a minimum FBC or SW; and generating $N^N$ further additional (artificial) codewords from previous sense values and from the new sense values. At 1506, the data storage controller applies at least one of the $N^N$ additional (artificial) codewords to a hard bit decoder or to a soft bit decoder. Blocks 1504 and 1506 may be repeated until either a codeword is decoded or a termination criteria is reached, as already explained.

Figure 16:
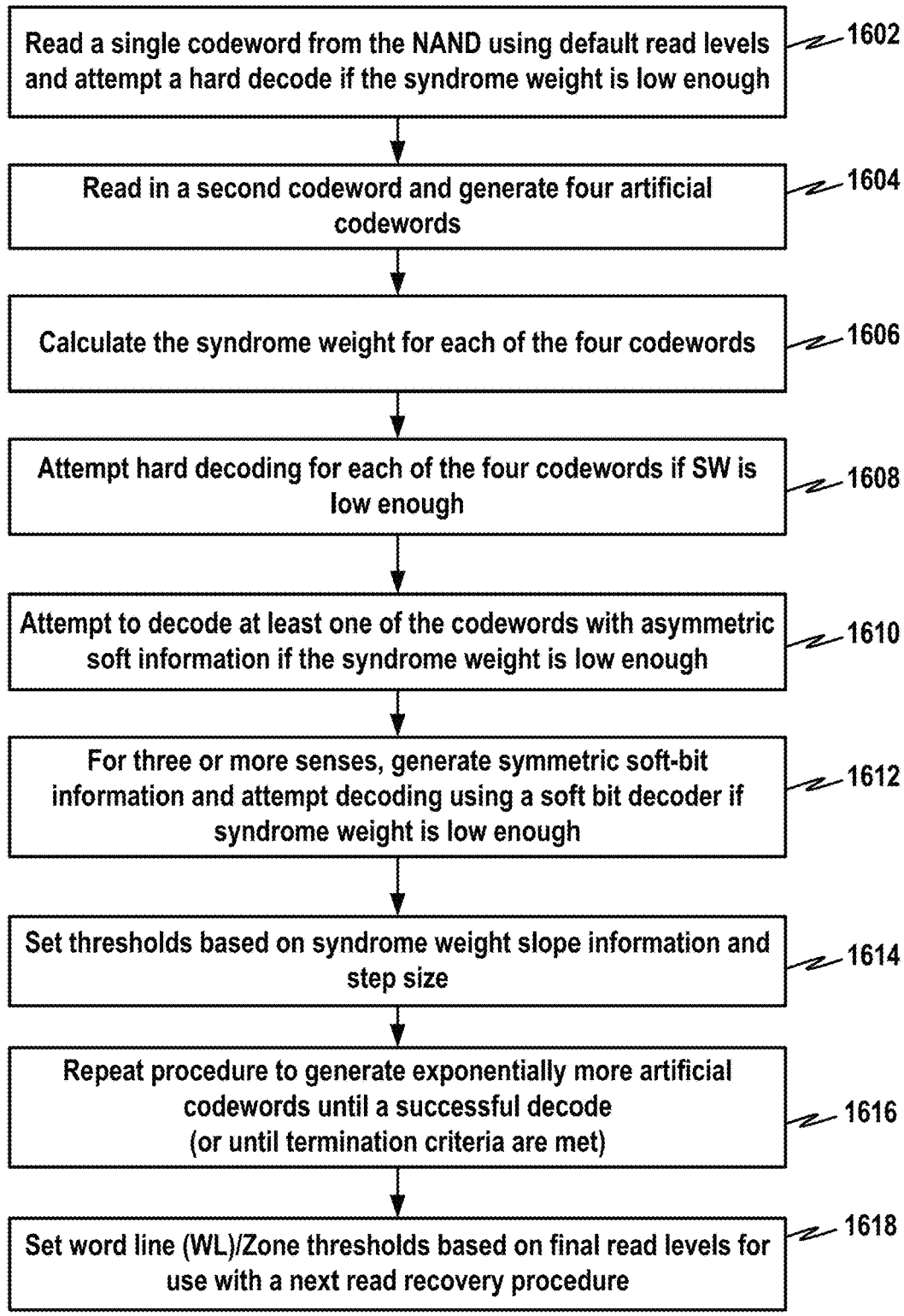
FIG. 16 is a flow chart summarizing additional exemplary operations for use by a data storage controller.

FIG. 16 summarizes additional exemplary operations 1600 for use by or with a data storage controller or other suitable device, including additional or alternative features. At 1602, the data storage controller reads a single codeword from the NAND using default read levels and attempts a hard decode if the syndrome weight is low enough. At 1604, the data storage controller reads in a second codeword and generates four artificial codewords. (See, above, for additional details of the exponential increase in codewords.) At 1606, the data storage controller calculates the syndrome weight for each of the four codewords. At 1608, the data storage controller attempts hard decoding for each of the four codewords if SW is low enough. At 1610, the data storage controller attempts to decode at least one of the codewords with asymmetric soft information if the syndrome weight is low enough. At 1612, for three or more senses, the data storage controller generates symmetric soft-bit information and attempt decoding using a soft bit decoder if syndrome weight is low enough. At 1614, the data storage controller sets thresholds based on syndrome weight slope information and step size. At 1616, the data storage controller repeats the aforementioned procedures to generate exponentially more artificial codewords until a successful decode (or until termination criteria are met). At 1618, the data storage controller sets word line (WL)/Zone thresholds based on final read levels for use with a next read recovery procedure (i.e. for the next time that normal read fails and the read recovery flow of the data controller is again activated).

The subject matter described herein can be implemented in any suitable NAND flash memory, including 2D or 3D NAND flash memory. Semiconductor memory devices include volatile memory devices, such as DRAM) or static random access memory ("SRAM") devices, nonvolatile memory devices, such as resistive random access memory ("ReRAM"), electrically erasable programmable read only memory ("EEPROM"), flash memory (which can also be considered a subset of EEPROM), ferroelectric random access memory ("PRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Various details of the presently disclosed subject matter may be changed without departing from the scope of the presently disclosed subject matter. Furthermore, the foregoing description is for the purpose of illustration only, and not for the purpose of limitation.

What is claimed is:

1. A method for use by a data storage controller, comprising:
    obtaining first and second codewords by reading initial sense values from a location in a memory device using first and second sense voltage thresholds shifted relative to one another;
    applying one or both of the first and second codewords to a decoder;
    generating one or more additional codewords from the initial sense values;
    applying the one or more additional codewords to the decoder to decode the one or more additional codewords; and
    iteratively generating an exponentially-increasing number of alternative codewords based on alternative sense values read from the location using alternative voltage thresholds shifted relative to the first and second sense voltage thresholds and relative to one another.

2. The method of claim 1, wherein the one or more additional codewords and the alternative codewords are artificial codewords.

3. The method of claim 1, wherein the one or more additional codewords and the alternative codewords are generated using binning.

4. The method of claim 1, wherein the decoder comprises a hard bit decoder and a soft bit decoder and wherein applying one or both of the first and second codewords to the decoder includes selecting one of the first and second codewords to apply to one or both of the hard bit and soft bit decoders.

5. The method of claim 4, wherein applying the one or more additional codewords comprises applying a selected one of the additional codewords to one or both of the hard and soft bit decoders.

6. The method of claim 5, further comprising:
    determining syndrome weights for the one or more additional codewords; and
    wherein applying the one or more additional codewords to the decoder includes identifying a particular codeword of the one or more additional codewords that has a lowest syndrome weight and applying the particular codeword to one or both of the hard and soft bit decoders.

7. The method of claim 1, further comprising determining a third sense voltage threshold by:
    determining failed bit counts (FBCs) associated with the first and second codewords;
    determining a gradient in the FBCs; and
    identifying a sense voltage for use as the third sense voltage based on the gradient.

8. The method of claim 7, wherein identifying the sense voltage for use as the third sense voltage includes determining a direction for shifting the sense voltage relative to the second sense voltage and a step size for shifting the sense voltage.

9. The method of claim 8, wherein the direction and the step size are selected to shift the sense voltage to achieve a minimum FBC for the third codeword.

10. The method of claim 8, wherein at least one FBC is estimated based on syndrome weights by looking up an estimated FBC using a precomputed maximum syndrome weight correction threshold for the decoder.

11. The method of claim 9, wherein iteratively generating an exponentially-increasing number of alternative codewords comprises:
    iteratively obtaining $N^N$ alternative codewords by
        performing an $N^{TH}$ sense operation to obtain an $N^{TH}$ codeword from the memory device by reading a set of new sense values from the memory device using an $N^{TH}$ sense voltage threshold shifted relative to previous sense voltage thresholds, and
        generating the $N^N$ alternative codewords from previous sense values and from the new sense values; and
    applying at least one of the $N^N$ alternative codewords to the decoder.

12. The method of claim 1, wherein the memory device is a non-volatile memory (NVM), and wherein the sense values are read from the NVM.

13. The method of claim 1, further comprising:
    applying the additional codewords to the decoder; and wherein iteratively generating the exponentially-increasing number of alternative codewords is performed in response to a failure to decode the additional codewords.

14. The method of claim 13, wherein each iteration to generate a next alternative codeword is performed in response to failure to decode a prior alternative codeword.

15. A data storage controller for use with a memory device, comprising:
a processing system configured to
perform a read operation to obtain first and second codewords corresponding to data stored at a location in the memory device by reading initial sense values from the memory device using first and second sense voltage thresholds shifted relative to one another;
apply one or both of the first and second codewords to a decoder;
generate one or more additional codewords from the initial sense values;
apply the one or more additional codewords to the decoder to decode the one or more additional codewords;
perform additional read operations to iteratively generate an exponentially-increasing number of alternative codewords based on alternative sense values read from the location using alternative voltage thresholds shifted relative to the first and second sense voltage thresholds and relative to one another.

16. The data storage controller of claim 15, wherein the processing system is configured to generate the one or more additional codewords and the alternative codewords using binning.

17. The data storage controller of claim 15, wherein the decoder comprises a hard bit decoder and a soft bit decoder and wherein the processing system is configured to select one of the first and second codewords to apply to one or both of the decoders.

18. The data storage controller of claim 17, wherein the processing system is configured to apply the additional codewords by applying a selected one of the additional codewords to one or both of the hard and soft bit decoders.

19. The data storage controller of claim 18, wherein the processing system is further configured to:
determine syndrome weights for the one or more additional codewords;
identify a particular codeword of the additional codewords that has a lowest syndrome weight; and
apply the particular codeword to one or both of the hard and soft bit decoders.

20. The data storage controller of claim 15, wherein the processing system is configured to determine a third sense voltage threshold by:
determining failed bit counts (FBCs) associated with the first and second codewords;
determining a gradient in the FBCs; and
identifying a sense voltage for use as the third sense voltage based on the gradient.

21. The data storage controller of claim 20, wherein the processing system is further configured to identify the sense voltage for use as the third sense voltage by determining one or more of a direction for shifting the sense voltage relative to the first and second sense voltages and a step size for shifting the sense voltage.

22. The data storage controller of claim 21, wherein the processing system is further configured to select the direction and the step size to shift the sense voltage to achieve a minimum FBC for the third codeword.

23. The data storage controller of claim 20, wherein the processing system is further configured to estimate at least one FBC based on syndrome weights by looking up an estimated FBC using a precomputed maximum syndrome weight correction threshold for the decoder.

24. The data storage controller of claim 15, wherein the processing system is further configured to iteratively generate the exponentially-increasing number of alternative codewords by:
iteratively obtain $N^{IN}$ alternative codewords by
perform an $N^{TH}$ sense operation to obtain an $N^{TH}$ codeword from the memory device by reading a set of new sense values from the memory device using an $N^{TH}$ sense voltage threshold shifted relative to previous sense voltage thresholds, and
generate $N^N$ alternative codewords from previous sense values and from the new sense values; and
apply at least one of the $N^N$ alternative codewords to the decoder.

25. The data storage controller of claim 24, wherein the processing system is further configured, for an N-level sense, to perform a single (N−1)-level sense to differentiate a set of bins obtained from the senses.

26. The data storage controller of claim 15, wherein the memory device is a non-volatile memory (NVM).

27. The data storage controller of claim 15, wherein the processing system is further configured to:
apply the additional codewords to the decoder; and
iteratively generate the exponentially-increasing number of alternative codewords in response to failure to decode the additional codewords.

28. The data storage controller of claim 27, wherein the processing system is further configured so that each iteration to generate a next alternative codeword is performed in response to failure to decode a prior alternative codeword.

29. An apparatus for use with a memory device, comprising:
means for obtaining first and second codewords corresponding to data stored in a location of the memory device by reading initial sense values from the memory device using first and second sense voltage thresholds shifted relative to one another;
means for applying one or both of the first and second codewords to a decoder;
means for generating one or more additional codewords from the initial sense values; and
means for applying the one or more additional codewords to the decoder to decode the one or more additional codewords;
means for reading alternative sense values from the location using alternative voltage thresholds shifted relative to the first and second sense voltage thresholds and relative to one another; and
means for iteratively generating an exponentially-increasing number of alternative codewords based on the alternative sense values.

* * * * *